United States Patent
Lin et al.

(10) Patent No.: US 10,490,712 B2
(45) Date of Patent: Nov. 26, 2019

(54) LIGHT EMITTER DEVICE PACKAGES, COMPONENTS, AND METHODS FOR IMPROVED CHEMICAL RESISTANCE AND RELATED METHODS

(75) Inventors: Shaow B. Lin, Cary, NC (US); Christopher P. Hussell, Cary, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/554,769

(22) Filed: Jul. 20, 2012

(65) Prior Publication Data
US 2013/0214298 A1 Aug. 22, 2013

Related U.S. Application Data

(60) Provisional application No. 61/510,310, filed on Jul. 21, 2011.

(51) Int. Cl.
*H01L 33/44* (2010.01)
*H01L 33/56* (2010.01)
*H01L 33/60* (2010.01)

(52) U.S. Cl.
CPC .......... *H01L 33/56* (2013.01); *H01L 33/60* (2013.01); *H01L 33/44* (2013.01); *H01L 2224/48091* (2013.01); *H01L 2224/48137* (2013.01); *H01L 2224/48247* (2013.01); *H01L 2924/181* (2013.01)

(58) Field of Classification Search
CPC ......... H01L 33/56; H01L 33/44; H01L 33/46; H01L 33/48; H01L 33/52; H01L 33/50; H01L 33/507; H01L 33/60
USPC ............................................ 257/99, 100, 88
See application file for complete search history.

(56) References Cited

U.S. PATENT DOCUMENTS

| | | |
|---|---|---|
| 3,288,728 A | 11/1966 | Gorham |
| 3,609,475 A | 9/1971 | Kaposhilin |
| 3,875,456 A | 4/1975 | Kano et al. |
| H445 H | 3/1988 | Bock et al. |
| 4,918,497 A | 4/1990 | Edmond |
| 4,946,547 A | 8/1990 | Palmour |
| 4,966,862 A | 10/1990 | Edmond |

(Continued)

FOREIGN PATENT DOCUMENTS

| | | |
|---|---|---|
| CN | 101 047 220 | 10/2007 |
| CN | 101276870 A | 10/2008 |

(Continued)

OTHER PUBLICATIONS

Non-Final Office Action for U.S. Appl. No. 13/312,508 dated Dec. 17, 2013.

(Continued)

*Primary Examiner* — Fazli Erdem
(74) *Attorney, Agent, or Firm* — Jenkins, Wilson, Taylor & Hunt, P.A.

(57) ABSTRACT

Light emitter packages, components, and related methods for providing improved chemical resistance are provided herein. In one aspect, a component of a light emitter package is provided. The component can include a base material, a silver (Ag) containing material at least partially disposed over the base material, and a portion of phenyl containing silicone encapsulant at least partially disposed over the Ag portion. The component can be incorporated within a surface mount device (SMD) type light emitter package.

19 Claims, 13 Drawing Sheets

(56) References Cited

U.S. PATENT DOCUMENTS

| | | | |
|---|---|---|---|
| 5,027,168 A | 6/1991 | Edmond |
| 5,200,022 A | 4/1993 | Kong |
| 5,210,051 A | 5/1993 | Carter, Jr. |
| 5,338,944 A | 8/1994 | Edmond |
| 5,359,345 A | 10/1994 | Hunter |
| RE34,861 E | 2/1995 | Davis |
| 5,393,993 A | 2/1995 | Edmond |
| 5,416,342 A | 5/1995 | Edmond |
| 5,523,589 A | 6/1996 | Edmond |
| 5,604,135 A | 2/1997 | Edmond |
| 5,631,190 A | 5/1997 | Negley |
| 5,739,554 A | 4/1998 | Edmond |
| 5,912,477 A | 6/1999 | Negley |
| 5,959,316 A | 9/1999 | Lowery |
| 6,120,600 A | 9/2000 | Edmond |
| 6,121,637 A | 9/2000 | Isokawa et al. |
| 6,187,606 B1 | 2/2001 | Edmond |
| 6,201,262 B1 | 3/2001 | Edmond |
| 6,252,254 B1 | 6/2001 | Soules et al. |
| 6,350,041 B1 | 2/2002 | Tarsa et al. |
| 6,514,782 B1 | 2/2003 | Wierer, Jr. et al. |
| 6,576,930 B2 | 6/2003 | Reeh et al. |
| 6,600,175 B1 | 7/2003 | Baretz |
| 6,717,353 B1 | 4/2004 | Mueller et al. |
| 6,791,119 B2 | 9/2004 | Slater, Jr. |
| 6,853,010 B2 | 2/2005 | Slater, Jr. |
| 6,860,621 B2 | 3/2005 | Bachl et al. |
| 6,936,857 B2 | 8/2005 | Doxsee et al. |
| 6,958,497 B2 | 10/2005 | Emerson |
| 7,005,679 B2 | 2/2006 | Tarsa et al. |
| 7,026,661 B2 | 4/2006 | Murano |
| 7,087,936 B2 | 8/2006 | Negley |
| 7,095,056 B2 | 8/2006 | Vitta |
| 7,183,577 B2 | 2/2007 | Mueller-Mach |
| 7,211,835 B2 | 5/2007 | Ono |
| 7,213,940 B1 | 5/2007 | Van De Ven |
| 7,244,965 B2 | 7/2007 | Andrews et al. |
| 7,246,930 B2 | 7/2007 | Yatsuda et al. |
| 7,250,715 B2 | 7/2007 | Mueller et al. |
| 7,304,326 B2 | 12/2007 | Suehiro et al. |
| 7,344,902 B2 | 3/2008 | Basin et al. |
| 7,456,499 B2 | 11/2008 | Loh |
| 7,476,909 B2 | 1/2009 | Nagai et al. |
| 7,534,635 B1* | 5/2009 | Foust et al. ............... 438/25 |
| 7,564,180 B2 | 7/2009 | Brandes |
| 7,598,669 B2 | 10/2009 | Toguchi et al. |
| 7,638,811 B2 | 12/2009 | Slater |
| 7,655,957 B2 | 2/2010 | Loh |
| 7,709,853 B2 | 5/2010 | Medendorp |
| 7,791,061 B2 | 9/2010 | Edmond et al. |
| 7,821,023 B2 | 10/2010 | Yuan et al. |
| 7,825,575 B2 | 11/2010 | Sawanobori et al. |
| 7,833,073 B2 | 11/2010 | Ogawa |
| 7,842,526 B2 | 11/2010 | Hadame et al. |
| 7,868,343 B2 | 1/2011 | Negley |
| 7,948,076 B2 | 5/2011 | Wang et al. |
| 7,952,115 B2 | 5/2011 | Loh |
| 8,011,818 B2 | 9/2011 | Negley |
| 8,052,307 B2 | 11/2011 | Bak et al. |
| 8,058,088 B2 | 11/2011 | Cannon |
| 8,319,240 B2 | 11/2012 | Nakayama |
| 8,378,379 B2 | 2/2013 | Tanida et al. |
| 8,398,892 B2 | 3/2013 | Shioi |
| 8,723,200 B2 | 5/2014 | Cho et al. |
| 8,858,022 B2 | 10/2014 | Jiang et al. |
| 8,946,747 B2 | 2/2015 | Reiherzer |
| 8,957,580 B2 | 2/2015 | Reiherzer |
| 9,055,700 B2 | 6/2015 | Humphries et al. |
| 9,240,530 B2 | 1/2016 | Reiherzer |
| 9,343,441 B2 | 5/2016 | Reiherzer |
| 9,496,466 B2 | 11/2016 | Hussell et al. |
| 10,008,637 B2 | 6/2018 | Britt et al. |
| 10,211,380 B2 | 2/2019 | Lin et al. |
| 2002/0004577 A1 | 1/2002 | Biebuyck et al. |
| 2002/0163006 A1 | 11/2002 | Yoganandan et al. |
| 2003/0067761 A1 | 4/2003 | Horiuchi et al. |
| 2004/0069993 A1 | 4/2004 | Murano |
| 2004/0079957 A1 | 4/2004 | Andrews et al. |
| 2004/0252501 A1 | 12/2004 | Moriyama |
| 2005/0007783 A1 | 1/2005 | Ono |
| 2005/0045898 A1 | 3/2005 | Leu et al. |
| 2005/0093430 A1 | 5/2005 | Ibbetson et al. |
| 2005/0159581 A1 | 7/2005 | Vanderzande et al. |
| 2005/0194609 A1 | 9/2005 | Furukawa |
| 2005/0224830 A1 | 10/2005 | Blonder et al. |
| 2006/0091415 A1 | 5/2006 | Yan |
| 2006/0091788 A1 | 5/2006 | Yan |
| 2006/0099449 A1 | 5/2006 | Amano et al. |
| 2006/0105484 A1 | 5/2006 | Basin |
| 2006/0113906 A1 | 6/2006 | Ogawa |
| 2006/0124953 A1 | 6/2006 | Negley et al. |
| 2006/0138621 A1* | 6/2006 | Bogner .................. H01L 33/64 |
| | | 257/678 |
| 2006/0145172 A1 | 7/2006 | Se et al. |
| 2006/0163589 A1 | 7/2006 | Fan et al. |
| 2006/0181866 A1 | 8/2006 | Jung et al. |
| 2006/0186418 A1 | 8/2006 | Edmond |
| 2006/0221272 A1 | 10/2006 | Negley |
| 2006/0226759 A1 | 10/2006 | Masuda et al. |
| 2007/0012940 A1 | 1/2007 | Suh et al. |
| 2007/0090383 A1 | 4/2007 | Ota et al. |
| 2007/0139923 A1 | 6/2007 | Negley |
| 2007/0158668 A1 | 7/2007 | Tarsa |
| 2007/0170447 A1 | 7/2007 | Negley |
| 2007/0182323 A1 | 8/2007 | Ogata et al. |
| 2007/0223219 A1 | 9/2007 | Medendorp et al. |
| 2007/0228387 A1 | 10/2007 | Negley et al. |
| 2007/0253209 A1 | 11/2007 | Loh |
| 2007/0268694 A1 | 11/2007 | Bailey et al. |
| 2008/0012036 A1 | 1/2008 | Loh |
| 2008/0080165 A1 | 4/2008 | Kim et al. |
| 2008/0121921 A1 | 5/2008 | Loh |
| 2008/0169758 A1 | 7/2008 | Cok |
| 2008/0173884 A1 | 7/2008 | Chitnis |
| 2008/0179611 A1 | 7/2008 | Chitnis |
| 2008/0179617 A1 | 7/2008 | Kadotani |
| 2008/0198112 A1 | 8/2008 | Roberts |
| 2008/0237616 A1 | 10/2008 | Hatakoshi et al. |
| 2008/0239724 A1 | 10/2008 | Moriyama et al. |
| 2008/0258130 A1 | 10/2008 | Bergmann |
| 2008/0081065 A1 | 11/2008 | Bulavin |
| 2008/0303052 A1* | 12/2008 | Lee et al. ............... 257/99 |
| 2008/0308825 A1 | 12/2008 | Chakraborty |
| 2009/0010017 A1 | 1/2009 | Hayashi et al. |
| 2009/0039375 A1 | 2/2009 | LeToquin |
| 2009/0050907 A1 | 2/2009 | Yuan |
| 2009/0050908 A1 | 2/2009 | Yuan |
| 2009/0050924 A1 | 2/2009 | Edmond |
| 2009/0065792 A1 | 3/2009 | Thompson et al. |
| 2009/0080185 A1 | 3/2009 | McMillan |
| 2009/0108281 A1 | 4/2009 | Keller et al. |
| 2009/0179213 A1 | 7/2009 | Cannon |
| 2009/0184616 A1 | 7/2009 | Van De Ven |
| 2009/0194782 A1 | 8/2009 | Hata et al. |
| 2009/0212316 A1 | 8/2009 | Braune et al. |
| 2009/0231833 A1 | 9/2009 | Miki et al. |
| 2009/0236621 A1 | 9/2009 | Chakraborty |
| 2009/0236759 A1 | 9/2009 | Kashiwagi |
| 2009/0250714 A1 | 10/2009 | Yun et al. |
| 2009/0261374 A1 | 10/2009 | Hayashi |
| 2009/0283779 A1 | 11/2009 | Negley et al. |
| 2009/0295265 A1 | 12/2009 | Tabuchi et al. |
| 2009/0309116 A1 | 12/2009 | Kato et al. |
| 2009/0315057 A1 | 12/2009 | Konishi et al. |
| 2010/0025699 A1 | 2/2010 | Liu |
| 2010/0025709 A1 | 2/2010 | Koseki et al. |
| 2010/0090244 A1 | 4/2010 | Ohba |
| 2010/0102344 A1 | 4/2010 | Ueji |
| 2010/0103660 A1 | 4/2010 | Van de Ven et al. |
| 2010/0133556 A1 | 6/2010 | Li et al. |
| 2010/0155763 A1 | 6/2010 | Donofrio |
| 2010/0200874 A1* | 8/2010 | Shioi et al. ............... 257/91 |
| 2010/0203657 A1 | 8/2010 | Kim |
| 2010/0208487 A1 | 8/2010 | Li |

(56) References Cited

U.S. PATENT DOCUMENTS

| | | | |
|---|---|---|---|
| 2010/0213502 A1* | 8/2010 | Kashiwagi et al. | 257/100 |
| 2010/0226130 A1 | 9/2010 | Cheng et al. | |
| 2010/0237375 A1 | 9/2010 | Yamazaki et al. | |
| 2010/0252851 A1 | 10/2010 | Emerson et al. | |
| 2010/0258830 A1 | 10/2010 | Ide et al. | |
| 2010/0283381 A1 | 11/2010 | Takahashi et al. | |
| 2010/0289395 A1 | 11/2010 | Sun et al. | |
| 2011/0001148 A1 | 1/2011 | Sun et al. | |
| 2011/0031513 A1* | 2/2011 | Hsieh | H01L 33/44 257/88 |
| 2011/0046319 A1 | 2/2011 | Ueno et al. | |
| 2011/0204398 A1 | 8/2011 | Tanida et al. | |
| 2011/0220920 A1 | 9/2011 | Collins | |
| 2011/0220929 A1 | 9/2011 | Collins et al. | |
| 2011/0220939 A1 | 9/2011 | Nakayama | |
| 2011/0241049 A1 | 10/2011 | Tanida et al. | |
| 2011/0242806 A1 | 10/2011 | Ramer et al. | |
| 2011/0248289 A1 | 10/2011 | Hsieh et al. | |
| 2011/0253429 A1 | 10/2011 | Humphries et al. | |
| 2011/0272721 A1 | 11/2011 | Butterworth | |
| 2011/0278618 A1* | 11/2011 | Nakayama | H01L 33/44 257/98 |
| 2011/0284897 A1 | 11/2011 | Takayama | |
| 2012/0007119 A1 | 1/2012 | Shiobara et al. | |
| 2012/0126257 A1 | 5/2012 | Reiherzer et al. | |
| 2012/0161621 A1 | 6/2012 | Sato | |
| 2012/0193649 A1 | 8/2012 | Donofrio | |
| 2012/0193660 A1 | 8/2012 | Donofrio | |
| 2013/0020590 A1* | 1/2013 | Lin et al. | 257/88 |
| 2013/0141905 A1 | 6/2013 | Hussell | |
| 2013/0141920 A1 | 6/2013 | Emerson | |
| 2013/0161650 A1 | 6/2013 | Lin | |
| 2013/0168719 A1 | 7/2013 | Watkins et al. | |
| 2013/0207130 A1 | 8/2013 | Reiherzer | |
| 2013/0207141 A1 | 8/2013 | Reiherzer | |
| 2013/0207142 A1 | 8/2013 | Reiherzer | |
| 2013/0208442 A1 | 8/2013 | Reiherzer | |
| 2019/0165228 A1 | 5/2019 | Lin et al. | |

FOREIGN PATENT DOCUMENTS

| | | |
|---|---|---|
| CN | 101438424 A | 5/2009 |
| CN | 101514806 A | 8/2009 |
| CN | 101 814 571 A | 8/2010 |
| CN | 102150480 | 8/2011 |
| CN | 102163680 | 8/2011 |
| CN | 201918428 | 8/2011 |
| CN | 102192423 A | 9/2011 |
| CN | 102214775 | 10/2011 |
| CN | 102214776 A | 10/2011 |
| CN | 103782402 | 5/2014 |
| CN | 104247055 | 12/2014 |
| CN | 104247060 | 12/2014 |
| CN | 103988324 B | 3/2017 |
| CN | 103782402 B | 12/2017 |
| CN | 104115293 B | 7/2018 |
| EP | 1536487 | 6/2005 |
| EP | 2056363 A2 | 5/2009 |
| EP | 2365549 A1 | 9/2011 |
| EP | 2226553 A3 | 1/2014 |
| EP | 2786429 | 10/2014 |
| EP | 2791982 | 10/2014 |
| EP | 2791984 | 10/2014 |
| JP | S58 67077 A | 4/1983 |
| JP | 2001-291406 | 10/2001 |
| JP | 2003-243704 A | 8/2003 |
| JP | 2005-244226 | 9/2005 |
| JP | 2006-054209 A | 2/2006 |
| JP | 2006-245443 | 9/2006 |
| JP | 2007-266343 A | 10/2007 |
| JP | 2008-010591 A | 1/2008 |
| JP | 2009-033107 A | 2/2009 |
| JP | 2009-076948 A | 4/2009 |
| JP | 2009-111395 | 5/2009 |
| JP | 2009-170825 | 7/2009 |
| JP | 2009-532900 A | 9/2009 |
| JP | 2009-224536 A | 10/2009 |
| JP | 2010-007013 A | 1/2010 |
| JP | 2010-092956 A | 4/2010 |
| JP | 2010-103404 | 5/2010 |
| JP | 2010-135277 A | 6/2010 |
| JP | 2010-206015 A | 9/2010 |
| JP | 2010-226093 A | 10/2010 |
| JP | 2010-239043 A | 10/2010 |
| JP | 2011-096793 A | 5/2011 |
| JP | 2011-127011 | 6/2011 |
| JP | 2011-134508 | 7/2011 |
| KR | 10-0705552 | 4/2007 |
| KR | 10-2007-0084959 | 8/2007 |
| KR | 10-2007-0100124 | 10/2007 |
| KR | 10-2010-0079970 | 7/2010 |
| KR | 10-2010-0086955 | 8/2010 |
| KR | 10-2011-0111243 | 10/2011 |
| TW | 2008/21371 A | 5/2008 |
| TW | 2009/03859 A | 1/2009 |
| TW | 2011/09370 A | 3/2011 |
| WO | WO 2004/077580 A2 | 9/2004 |
| WO | WO 2009-107052 | 9/2009 |
| WO | WO 2010-113852 | 10/2010 |
| WO | WO 2011-109097 | 9/2011 |
| WO | WO 2013-013154 | 1/2013 |
| WO | WO 2013-082445 | 6/2013 |
| WO | WO 2013-085793 | 6/2013 |
| WO | WO 2013-085816 | 6/2013 |
| WO | WO 2013/0101385 | 7/2013 |

OTHER PUBLICATIONS

"SCS Parylene Coatings for LEDS," Specialty Coating Systems, 2009, pp. 1-2, Indianapolis, IN, USA.
"SCS Electronic Coatings," Specialty Coating Systems, 2010, pp. 1-4, Indianapolis, IN, USA.
International Search Report and Written Opinion for Application No. PCT/US2012/067323 dated Mar. 15, 2013.
International Search Report and Written Opinion for Application No. PCT/US2012/067326 dated Mar. 15, 2013.
International Search Report and Written Opinion for Application No. PCT/US2012/067055 dated Mar. 28, 2013.
International Search Report and Written Opinion for Application No. PCT/US2012/067058 dated Mar. 29, 2013.
Non-Final Office Action for U.S. Appl. No. 13/372,076 dated Aug. 8, 2013.
Restriction Requirement for U.S. Appl. No. 13/309,177 dated Sep. 16, 2013.
Restriction Requirement for U.S. Appl. No. 13/372,076 dated Jan. 31, 2013.
International Search Report and Written Opinion for Application No. PCT/US2012/047608 dated Jan. 31, 2013.
U.S. Appl. No. 13/372,063 dated Feb. 13, 2012.
U.S. Appl. No. 13/444,394 dated Apr. 11, 2012.
U.S. Appl. No. 13/444,399 dated Apr. 11, 2012.
U.S. Appl. No. 13/372,076 dated Feb. 13, 2012.
U.S. Appl. No. 13/309,117 dated Dec. 1, 2011.
U.S. Appl. No. 13/312,508 dated Dec. 6, 2011.
U.S. Appl. No. 13/312,518 dated Dec. 6, 2011.
U.S. Appl. No. 12/757,891 dated Apr. 9, 2010.
Ming Ma, et al., Effects of the refractive index of the encapsulant on the light-extraction efficiency of light-emitting diodes, Optics Express, Sep. 12, 2011, pp. A1135-A1140, vol. 19, No. S5.
Non-Final Office Action for U.S. Appl. No. 13/372,076 dated Mar. 18, 2014.
Non-Final Office Action for U.S. Appl. No. 13/312,518 dated Jul. 17, 2014.
Non-Final Office Action for U.S. Appl. No. 13/444,394 dated Jul. 22, 2014.
Non-Final Office Action for U.S. Appl. No. 13/372,063 dated Jul. 28, 2014.
Final Office Action for U.S. Appl. No. 13/312,508 dated Aug. 20, 2014.

(56) References Cited

OTHER PUBLICATIONS

Non-Final Office Action for U.S. Appl. No. 13/309,177 dated Feb. 13, 2014.
Non-Final Office Action for U.S. Appl. No. 13/312,518 dated Feb. 28, 2014.
Restriction Requirement for U.S. Appl. No. 13/372,063 dated Apr. 10, 2014.
Restriction Requirement for U.S. Appl. No. 13/691,102 dated Apr. 11, 2014.
Non-Final Office Action for U.S. Appl. No. 13/309,177 dated Sep. 11, 2014.
Restriction Requirement for U.S. Appl. No. 13/691,102 dated Oct. 3, 2014.
Final Office Action for U.S. Appl. No. 13/312,518 dated Nov. 24, 2014.
Non-Final Office Action for U.S. Appl. No. 13/444,399 dated Nov. 14, 2014.
Japanese Office Action for Application No. 2014/521828 dated Jan. 6, 2015.
Final Office Action for U.S. Appl. No. 13/444,394 dated Jan. 15, 2015.
Taiwanese Office Action for Application No. 101126247 dated Dec. 19, 2014.
"Press Release Nichia Corporation" posted to http://www.nichia.com/en/about_nichia/2010/2010_110201.html on Nov. 2, 2010, captured by Wayback Machine on Dec. 1, 2011, accessed on Nov. 7, 2014.
Non-Final Office Action for U.S. Appl. No. 13/691,102 dated Apr. 24, 2015.
Japanese Office Action for Application No. 2014-545949 dated May 19, 2015.
Notice of Allowance for U.S. Appl. No. 13/444,394 dated Jun. 5, 2015.
Korean Office Action for Application No. 10 2014 7018692 dated Jun. 9, 2015.
Korean Office Action for Application No. 10 2014 7018718 dated Jun. 10, 2015.
Supplementary European Search Report for Application No. EP 12855245 dated Jun. 12, 2015.
Extended European Search Report for Application No. EP 12863904 dated Jun. 22, 2015.
Extended European Search Report for Application No. EP 12853831 dated Jun. 22, 2015.
Notice of Allowance for U.S. Appl. No. 13/444,394 dated Jun. 29, 2015.
Final Office Action for U.S. Appl. No. 13/312,508 dated Jul. 22, 2015.
Final Office Action for U.S. Appl. No. 13/312,518 dated Aug. 4, 2015.
Non-Final Office Action for U.S. Appl. No. 13/444,394 dated Aug. 27, 2015.
Notice of Allowance for U.S. Appl. No. 13/372,076 dated Oct. 7, 2014.
Notice of Allowance for U.S. Appl. No. 13/372,063 dated Oct. 8, 2014.
Notice of Allowance for U.S. Appl. No. 13/372,063 dated Jan. 22, 2015.
Notice of Allowance for U.S. Appl. No. 13/444,394 dated Sep. 11, 2015.
Final Office Action for U.S. Appl. No. 13/309,177 dated Nov. 16, 2015.
Non-Final Office Action for U.S. Appl. No. 13/312,508 dated Nov. 17, 2015.
Non-Final Office Action for U.S. Appl. No. 13/312,518 dated Dec. 3, 2015.
Notice of Allowance for U.S. Appl. No. 13/444,399 dated Jan. 15, 2016.
First Chinese Office Action for Application No. 2012 800 440 227 dated Jan. 15, 2016.
Advisory Action for U.S. Appl. No. 13/309,177 dated Feb. 12, 2016.
Final Office Action for U.S. Appl. No. 13/691,102 dated Feb. 25, 2016.
Non-Final Office Action for U.S. Appl. No. 13/312,518 dated Mar. 13, 2015.
Narukawa et al. "White light emitting diodes with super-high luminous efficacy", Journal Of Physics D, 43 (2010) 354002.
Korean Office Action for Application No. 10-2014-7004030 dated Feb. 9, 2015.
Non-Final Office Action for U.S. Appl. No. 13/312,508 dated Feb. 18, 2015.
Non-Final Office Action for U.S. Appl. No. 13/309,177 dated Apr. 23, 2015.
Final Office Action for U.S. Appl. No. 13/444,399 dated Apr. 28, 2015.
Chinese Office Action for Application No. 2012 800604373 dated Feb. 15, 2016.
Chinese Office Action for Application No. 2012 800 690 449 dated Apr. 6, 2016.
Advisory Action for U.S. Appl. No. 13/691,102 dated May 20, 2016.
Chinese Office Action for Application No. 201280068933 dated May 27, 2016.
Final Office Action for U.S. Appl. No. 13/312,518 dated Jun. 1, 2016.
Non-Final Office Action for U.S. Appl. No. 13/309,177 dated Jun. 9, 2016.
Chinese Office Action for Application No. 201280068934 dated Jun. 14, 2016.
Examiner-Initiated Interview Summary for U.S. Appl. No. 13/312,508 dated Jul. 1, 2016.
Notice of Allowance for U.S. Appl. No. 13/312,508 dated Jul. 1, 2016.
Chinese Office Action for Application No. 201280060437 dated Jul. 22, 2016.
Non-Final Office Action for U.S. Appl. No. 13/691,102 dated Aug. 5, 2016.
Chinese Office Action for Application No. 2012800440227 dated Aug. 9, 2016.
Chinese Office Action for Application No. 2012800690449 dated Nov. 16, 2016.
Non-Final Office Action for U.S. Appl. No. 13/312,518 dated Nov. 30, 2016.
Final Office Action for U.S. Appl. No. 13/309,177 dated Dec. 21, 2016.
Chinese Notice of Allowance for Application No. 201280060437 dated Dec. 29, 2016.
Final Office Action for U.S. Appl. No. 13/691,102 dated Feb. 10, 2017.
Chinese Office Action for Application No. 2012800440227 dated Feb. 24, 2017.
Chinese Office Action for Application No. 2012800690449 dated May 27, 2017.
Non-Final Office Action for U.S. Appl. No. 13/309,177 dated Apr. 11, 2017.
Notice of Allowance with Interview Summary for U.S. Appl. No. 13/312,518 dated Sep. 18, 2017.
Chinese Notice of Allowance for Chinese Application No. 201280044022.7 dated Sep. 27, 2017.
Non-Final Office Action for U.S. Appl. No. 13/691,102 dated Oct. 4, 2017.
Final Office Action for U.S. Appl. No. 13/309,177 dated Oct. 20, 2017.
Advisory Action for U.S. Appl. No. 13/309,177 dated Jan. 24, 2018.
Non-Final Office Action for U.S. Appl. No. 13/544,769 dated Mar. 7, 2018.
Japanese Search Report for Application No. 2014-521828 dated Dec. 26, 2014; retrieved from Global Dossier on Oct. 16, 2018.
Decision of Refusal for Japanese Application No. 2014-521828 dated Aug. 18, 2015.
Korean Office Action for Application No. 10-2014-7004030 dated Sep. 22, 2015.
First Search for Chinese Application No. 201280044022.7 dated Jan. 6, 2016; retrieved from Global Dossier on Oct. 16, 2018.

(56) References Cited

OTHER PUBLICATIONS

First Search for Chinese Application No. 201280068934 dated Jun. 3, 2016; retrieved from Global Dossier on Oct. 16, 2018.
Non-Final Office Action for U.S. Appl. No. 13/309,177 dated Apr. 6, 2018.
Final Office Action for U.S. Appl. No. 13/691,102 dated Apr. 6, 2018.
Applicant Initiated Interview Summary for U.S. Appl. No. 13/691,102 dated Jun. 7, 2018.
Notice of Allowance for U.S. Appl. No. 13/309,177 dated Oct. 4, 2018.
Non-Final Office Action for U.S. Appl. No. 13/691,102 dated Oct. 4, 2018.
"Diameter_Definition of Diameter by Merriam-Webster", accessed at http://www.merriam-webster.com/dictionary/diameter on Nov. 22, 2016.
Non-Final Office Action for U.S. Appl. No. 13/691,102 dated Jul. 25, 2019.

* cited by examiner

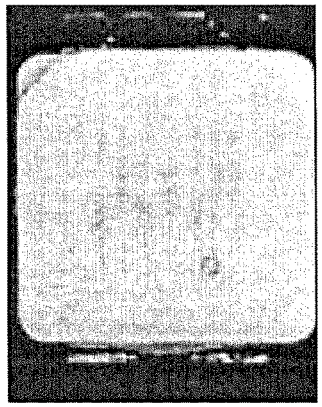
FIG. 7A OPTIMIZED PRODUCT — MODERATE SULFUR EXPOSURE (70C, LEVEL 1)
FIG. 7B EXTENDED SULFUR EXPOSURE (70C, LEVEL 3)
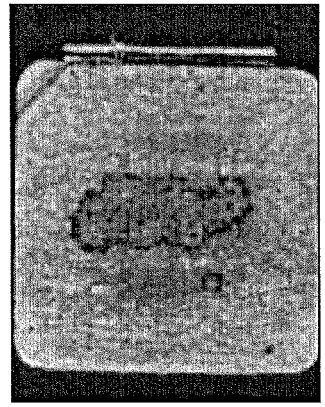
FIG. 6A NON-OPTIMIZED PRODUCT — MODERATE SULFUR EXPOSURE (70C, LEVEL 1)
FIG. 6B EXTENDED SULFUR EXPOSURE (70C, LEVEL 3)

OPTIMIZED LEVEL 3

NON-OPTIMIZED LEVEL 3

LIGHT EMITTER DEVICE PACKAGES, COMPONENTS, AND METHODS FOR IMPROVED CHEMICAL RESISTANCE AND RELATED METHODS

CROSS REFERENCE TO RELATED APPLICATIONS

This application claims priority to U.S. Provisional Patent Application Ser. No. 61/510,310, filed Jul. 21, 2011, the disclosure of which is hereby incorporated by reference in the entirety.

TECHNICAL FIELD

The subject matter disclosed herein relates generally to packages, components, and related methods for use with light emitter devices, such as light emitting diodes (LEDs). More particularly, the subject matter disclosed herein relates to packages, components, and methods for improved chemical resistance and improved chemical properties.

BACKGROUND

Light emitter devices, such as light emitting diodes (LEDs), may be utilized in packages for providing white light (e.g., perceived as being white or near-white), and are developing as replacements for incandescent, fluorescent, and metal halide high-intensity discharge (HID) light products. Conventional LED packages may include filling materials, such as encapsulants with or without one or more phosphors disposed therein. Conventional encapsulants may be gas permeable which can allow undesirable chemicals and/or chemical vapors to enter the LED package and degrade various components within the package. For example, vapors containing sulfur, sulfur-containing compounds (e.g., sulfides, sulfites, sulfates, $SO_x$), chlorine and bromine containing complexes, nitride oxides (e.g., $NO_x$) and oxidizing organic vapor compounds may permeate the encapsulant and degrade various components within the LED package. Such degradation can adversely affect brightness, reliability, and thermal properties of LED components and packages over time.

Despite the availability of various LED packages and components in the marketplace, a need remains for packages, components, and related methods for improved chemical resistance. Packages, components, and methods disclosed herein can advantageously improve chemical resistance of the encapsulated LED package and/or package components, while promoting ease of manufacture and increasing reliability and performance in high power and/or high brightness applications. Described methods can be used and applied to make chemically resistant surface mount device (SMD) type LED packages of any size, thickness, and/or dimension, wherein the packages can comprise a single LED chip, multiple chips, and/or multi-arrays of LEDs. Packages, components, and methods disclosed herein are applicable to any range in size and/or build of LED chip, any die attach (e.g., eutectic, silicone, epoxy), and any type of body and/or reflector material (e.g., polyamide (PA), polyphthalamide (PPA), silicone or ceramic). Packages, components, and methods disclosed herein can be used for any LED chip type, for example, flip chip or sapphire chips. The subject matter herein can also provide protection against chemicals and chemical vapor and can serve as an anti-oxidation, anti-corrosion layer, and/or chemical-barrier layer, for example, over silver (Ag) or Ag-containing LED packages, copper (Cu), and substrates containing such metals.

SUMMARY

In accordance with this disclosure, light emitter device packages, components, and related methods are provided that are well suited for a variety of applications, including surface mount device (SMD) and multi-array packaging. It is, therefore, an object of the present disclosure herein to provide packages, components, and methods for light emitter devices with improved chemical resistance and improved chemical properties where zero or minimum loss of brightness occurs, in part by utilizing an optimized silicone encapsulant and/or a protective layer disposed over at least one silver (Ag) or Ag-containing component within the light emitter package.

These and other objects of the present disclosure as can become apparent from the disclosure herein are achieved, at least in whole or in part, by the subject matter disclosed herein.

BRIEF DESCRIPTION OF THE DRAWINGS

A full and enabling disclosure of the present subject matter including the best mode thereof to one of ordinary skill in the art is set forth more particularly in the remainder of the specification, including reference to the accompanying figures, in which:

FIGS. 6A and 6B are photographs of a non-optimized LED package according to the disclosure herein;

FIGS. 7A and 7B are photographs of an optimized LED package according to the disclosure herein;

FIGS. 10A to 10D are photographs of non-optimized and optimized packages at different chemical vapor exposure levels according to the disclosure herein;

DETAILED DESCRIPTION

Figure 1:
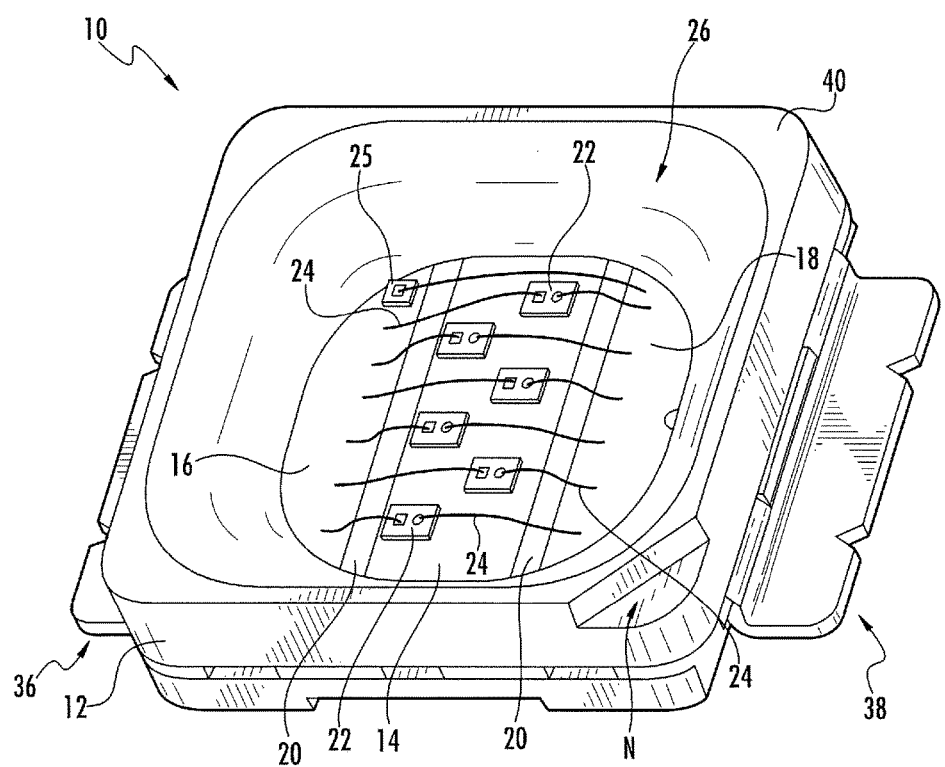
FIG. 1 is a top perspective view of a first embodiment of a light emitter diode (LED) package according to the disclosure herein.

The subject matter disclosed herein is directed to packages, components, and methods for use with light emitters, such as light emitting diodes (LEDs). Packages, components, and methods described herein exhibit improved performance, for example, improved chemical resistance. Notably, packages, components, and systems described herein can utilize one or more novel protective layers and/or encapsulant materials for providing improved packages and components.

As illustrated in the various figures, some sizes of structures or portions are exaggerated relative to other structures or portions for illustrative purposes and, thus, are provided to illustrate the general structures of the present subject matter. Furthermore, various aspects of the present subject matter are described with reference to a structure or a portion being formed on other structures, portions, or both. As will be appreciated by those of skill in the art, references to a structure being formed "on" or "above" another structure or portion contemplates that additional structure, portion, or both may intervene. References to a structure or a portion being formed "on" another structure or portion without an intervening structure or portion are described herein as being formed "directly on" the structure or portion. Similarly, it will be understood that when an element is referred to as being "connected", "attached", or "coupled" to another element, it can be directly connected, attached, or coupled to the other element, or intervening elements may be present. In contrast, when an element is referred to as being "directly connected", "directly attached", or "directly coupled" to another element, no intervening elements are present.

Furthermore, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the package or component in addition to the orientation depicted in the figures. For example, if the package or component in the figures is turned over, structure or portion described as "above" other structures or portions would now be oriented "below" the other structures or portions. Likewise, if the package or component in the figures is rotated along an axis, structure or portion described as "above", other structures or portions would be oriented "next to" or "left of" the other structures or portions. Like numbers refer to like elements throughout.

Unless the absence of one or more elements is specifically recited, the terms "comprising", including", and "having" as used herein should be interpreted as open-ended terms that do not preclude the presence of one or more elements.

Light emitter packages according to embodiments described herein can comprise Group III-V nitride (e.g., gallium nitride (GaN)) based LED chips or lasers. Fabrication of LED chips and lasers is generally known and only briefly described herein. LED chips or lasers can be fabricated on a growth substrate, for example, a silicon carbide (SiC) substrate, such as those devices manufactured and sold by Cree, Inc. of Durham, N.C. Other growth substrates are also contemplated herein, for example and not limited to sapphire, silicon (Si), and GaN. In one aspect, SiC substrates/layers can be 4H polytype silicon carbide substrates/layers. Other SiC candidate polytypes, such as 3C, 6H, and 15R polytypes, however, can be used. Appropriate SiC substrates are available from Cree, Inc., of Durham, N.C., the assignee of the present subject matter, and the methods for producing such substrates are set forth in the scientific literature as well as in a number of commonly assigned U.S. patents, including but not limited to U.S. Pat. No. Re. 34,861; U.S. Pat. No. 4,946,547; and U.S. Pat. No. 5,200,022, the disclosures of which are incorporated by reference herein in their entireties. Any other suitable growth substrates are contemplated herein.

As used herein, the term "Group III nitride" refers to those semiconducting compounds formed between nitrogen and one or more elements in Group III of the periodic table, usually aluminum (Al), gallium (Ga), and indium (In). The term also refers to binary, ternary, and quaternary compounds such as GaN, AlGaN and AlInGaN. The Group III elements can combine with nitrogen to form binary (e.g., GaN), ternary (e.g., AlGaN), and quaternary (e.g., AlInGaN) compounds. These compounds may have empirical formulas in which one mole of nitrogen is combined with a total of one mole of the Group III elements. Accordingly, formulas such as $Al_xGa_{1-x}N$ where $1>x>0$ are often used to describe these compounds. Techniques for epitaxial growth of Group III nitrides have become reasonably well developed and reported in the appropriate scientific literature.

Although various embodiments of LED chips disclosed herein can comprise a growth substrate, it will be understood by those skilled in the art that the crystalline epitaxial growth substrate on which the epitaxial layers comprising an LED chip are grown can be removed, and the freestanding epitaxial layers can be mounted on a substitute carrier substrate or substrate which can have different thermal, electrical, structural and/or optical characteristics than the original substrate. The subject matter described herein is not limited to structures having crystalline epitaxial growth substrates and can be used in connection with structures in which the epitaxial layers have been removed from their original growth substrates and bonded to substitute carrier substrates.

Group III nitride based LED chips according to some embodiments of the present subject matter, for example, can be fabricated on growth substrates (e.g., Si, SiC, or sapphire substrates) to provide horizontal devices (with at least two electrical contacts on a same side of the LED chip) or vertical devices (with electrical contacts on opposing sides of the LED chip). Moreover, the growth substrate can be maintained on the LED chip after fabrication or removed (e.g., by etching, grinding, polishing, etc.). The growth substrate can be removed, for example, to reduce a thickness of the resulting LED chip and/or to reduce a forward voltage through a vertical LED chip. A horizontal device (with or without the growth substrate), for example, can be flip chip bonded (e.g., using solder) to a carrier substrate or printed circuit board (PCB), or wirebonded. A vertical device (with or without the growth substrate) can have a first terminal (e.g., anode or cathode) solder bonded to a carrier substrate, mounting pad, or PCB and a second terminal (e.g., the opposing anode or cathode) wirebonded to the carrier substrate, electrical element, or PCB. Examples of vertical and horizontal LED chip structures are discussed by way of example in U.S. Publication No. 2008/0258130 to Bergmann et al. and in U.S. Pat. No. 7,791,061 to Edmond et al. which issued on Sep. 7, 2010, the disclosures of which are hereby incorporated by reference herein in their entireties.

One or more LED chips, and notably, portions of light emitter packages described herein such as the ceramic based submount, lens, and/or traces can be at least partially coated with one or more phosphors. The phosphors can absorb a portion of light from the LED chip and emit a different wavelength of light such that the light emitter package emits a combination of light from each of the LED chip and the phosphor. In one embodiment, the light emitter package emits what is perceived as white light resulting from a combination of light emission from the LED chip and the phosphor. In one embodiment according to the present subject matter, a white emitting package can consist of an LED chip that emits light in the blue wavelength spectrum and a phosphor that absorbs some of the blue light and re-emits light in the yellow wavelength spectrum. The package can therefore emit a white light combination of blue and yellow light. In other embodiments, the LED chips emit a non-white light combination of blue and yellow light as described in U.S. Pat. No. 7,213,940. LED chips emitting red light or LED chips covered by a phosphor that absorbs LED light and emits a red light are also contemplated herein.

LED chips can be coated with a phosphor using many different methods, with one suitable method being described in U.S. patent application Ser. Nos. 11/656,759 and 11/899,790, both entitled "Wafer Level Phosphor Coating Method and Devices Fabricated Utilizing Method", and both of which are incorporated herein by reference in their entireties. Other suitable methods for coating one or more LED chips are described in U.S. Pat. No. 8,058,088 entitled "Phosphor Coating Systems and Methods for Light Emitting Structures and Packaged Light Emitting Diodes Including Phosphor Coating" which issued on Nov. 15, 2011, and the continuation-in-part application U.S. patent application Ser. No. 12/717,048 entitled "Systems and Methods for Application of Optical Materials to Optical Elements", the disclosures of which are hereby incorporated by reference herein in their entireties. LED chips can also be coated using other methods such as electrophoretic deposition (EPD), with a suitable EPD method described in U.S. patent application Ser. No. 11/473,089 entitled "Close Loop Electrophoretic Deposition of Semiconductor Devices", which is also incorporated herein by reference in its entirety. It is understood that light emitter packages and methods according to the present subject matter can also have multiple LED chips of different colors, one or more of which can be white emitting.

Referring now to FIGS. 1 to 16, FIGS. 1 and 2 illustrate top and cross-sectional views of a light emitter or LED package, generally designated 10. In one aspect, LED package 10 can comprise a surface mount device (SMD) comprising a body 12 which can be molded or otherwise formed about a leadframe. The leadframe can comprise a thermal element 14 and one or more electrical elements 16 and 18, respectively. A corner notch, generally designated N can indicate electrical polarity of electrical elements 16 and 18. Thermal and electrical elements 14, 16, and 18 can comprise an electrically and/or thermally conductive material such as a metal or metal alloy. In one aspect, thermal element 14 can be electrically and/or thermally isolated from the one or more electrical elements 16 and 18 by one or more isolating portions 20 of the body.

One or more LED chips 22 can be mounted over thermal element 14 using any suitable die attach technique and/or materials, for example only and not limited to an epoxy die attach (e.g., silicone or silver (Ag) epoxy) or a metal-to-metal die attach technique such as flux assisted eutectic, non-eutectic, or thermal compression die attach. LED chips 22 can be electrically connected to each electrical element 16 and 18 via one or more electrically conductive wirebonds 24. Wirebonds 24 can communicate an electrical current or signal from electrical elements 16 and 18 to one or more LED chips 22 thereby causing illumination of the LED chips 22. Thermal and/or electrical elements 14 and/or 16,18, respectively, can be coated, plated, or otherwise layered with a reflective material (FIG. 2), such as, for example and without limitation, Ag or Ag-containing alloy for reflecting light from the one or more LED chips 22.

Body 12 can comprise any suitable material molded or otherwise disposed about thermal and electrical elements 14, 16, and 18, for example, a ceramic material or a molded plastic material such as polyamide (PA), polyphthalamide (PPA), silicone, or epoxy compound. At least one electrostatic discharge (ESD) protection devices 25 can be disposed within package 10 and can be electrically connected to electrical elements 16 and 18 and reverse biased with respect to LED chips 22. ESD devices 25 can protect against damage from ESD within package 10. In one aspect, different elements can be used as ESD protection devices 25 such as various vertical Si Zener diodes, different LEDs arranged reverse biased to LED chips 22, surface mount varistors and lateral Si diodes.

Figure 2:
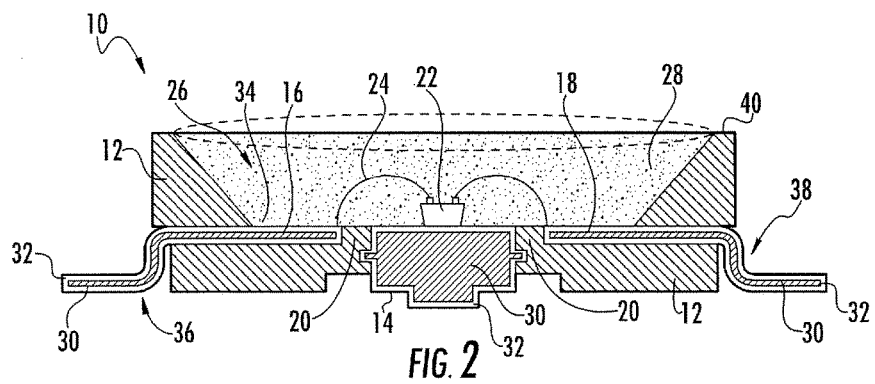
FIG. 2 is a cross-sectional view of the first embodiment of the LED package according to the disclosure herein.

Referring to FIGS. 1 and 2, body 12 of package 10 can optionally comprise a cavity, generally designated 26, for example, a reflector cavity optionally coated with a reflective material for reflecting light from the one or more LED chips 22. Although packages having reflectors and/or reflector cavities are shown, packages which do not have cavities are contemplated as well. As FIG. 2 illustrates, cavity 26 can be filled at least partially or completely with an encapsulant 28. Encapsulant can comprise one or more phosphor materials for interacting with light emitted from the one or more LED chips 22 to emit light from package 10 having a desired color. In one aspect, thermal element 14 and electrical elements 16 and 18 can comprise light emitter package components having a base material or core material 30 and a coating material 32. In one aspect, base or core material 30 and coating material 32 can comprise electrically and/or thermally conductive materials. Coating material 32 can be applied such that it either partially or entirely surrounds core material 30 as shown, or in other aspects coating material 32 can optionally plate or coat a single surface or more than one surfaces. In one aspect, coating material 32 can comprise a reflective portion of material such as Ag and/or a Ag-containing material. Base or core material 30 can comprise a metal core, for example, a metal or metal alloy such as copper (Cu), and optionally a metal layer such as nickel (Ni) disposed between the reflective material and the metal core. Coating material 32 can advantageously reflect light emitted from the one or more LED chips 22 and increase optical performance of package 10.

The leadframe comprising thermal and electrical elements 14, 16, and 18, respectively, can be disposed along a bottom floor 34 of cavity 26 such that respective upper surfaces of thermal and electrical elements 14, 16, and 18, respectively, can be disposed along the same plane and/or different planes. Electrical elements 16 and 18 can extend from one or more lateral sides of body 12 and form one or more external tab portions generally designated 36 and 38. Tab portions 36 and 38 can bend to form one or lower mounting surfaces such that package 10 can be mounted to an underlying substrate. Tab portions 36 and 38 can bend away from each other or inwardly towards each other thereby adapting either a J-bend or gull-wing orientation as known in the art. However, any configuration of external tabs 36 and 38 is contemplated.

Encapsulant 28 can be filled to any level within cavity 26 and may be disposed below and/or above a top surface 40 of package 10. In one aspect, encapsulant 28 can be filled such that it is flush with top surface 40 of package as shown. In other aspects, encapsulant 28 can be filled such that it forms a concave or convex surface with respect to top face 40 of package 10 as indicated by the broken lines in FIG. 2. As discussed further herein, encapsulant 28 can comprise an improved material and/or method of making the same that improves the chemical resistance of package 10. SMD type packages such as package 10 do not typically have a secondary optics (lens) to keep harmful elements from degrading coating material 32, such as Ag or Ag-containing components. Where coating material 32 comprises Ag, the Ag may over time become tarnished, corroded, or otherwise degraded if the package 10 has poor chemical resistance. For example, if undesirable chemical components permeate encapsulant 28, the Ag can tarnish or degrade thereby resulting in a loss of brightness output and noticeable darkening of surfaces along cavity floor 34. Notably, packages, components, and methods disclosed herein provide for improved chemical resistance and improved chemical properties where zero or minimum loss of brightness occurs, even in the presence of harmful chemicals and can be applicable to any SMD package or multi-array package disclosed herein. Such improvements can keep the Ag or Ag-containing components within package 10 from tarnishing, corroding, or otherwise degrading.

Figure 3:
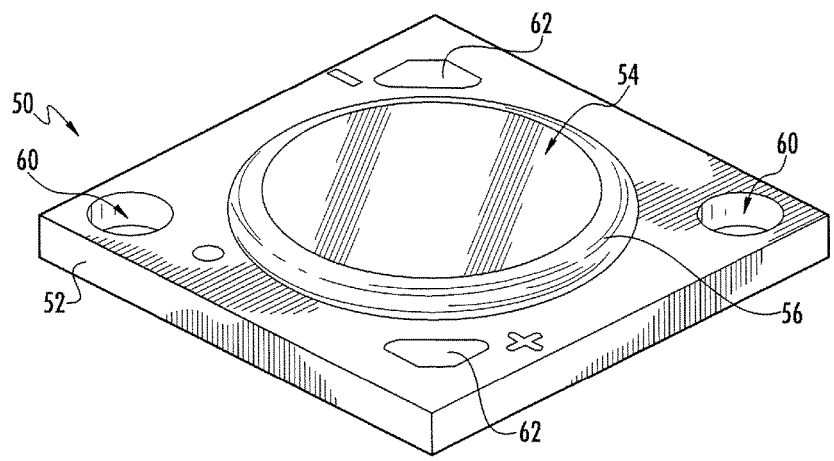
FIG. 3 is a top perspective view of a second embodiment of an LED package according to the disclosure herein.
Figure 4:
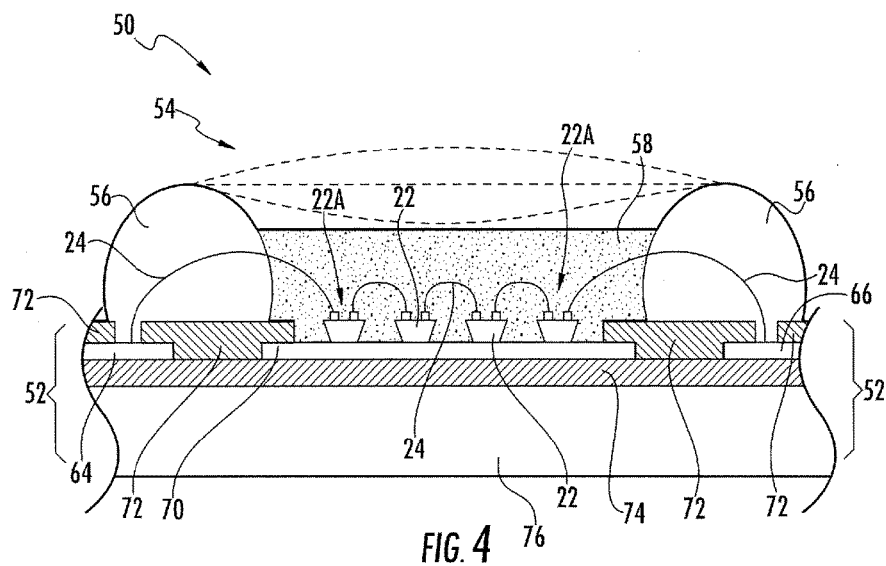
FIG. 4 is a cross-sectional view of the second embodiment of the LED package according to the disclosure herein.

FIGS. 3 and 4 illustrate top perspective and cross-sectional views of another embodiment of an LED package, generally designated 50. LED package 50 can comprise an SMD similar to package 10 in that a secondary optics is not used. Therefore, a possibility of degradation of package components exists where undesirable chemical vapors or complexes permeate the package. LED package 50 can comprise a substrate 52 over which an emission area, generally designated 54, can be disposed. In one aspect, emission area 54 can be disposed substantially centrally with respect to LED package 50. In the alternative, emission area 54 can be disposed in any location over LED package 50, for example, in a corner or adjacent to an edge. Any location is contemplated. Emission area 54 can comprise any suitable shape such as a substantially circular, square, oval, or rectangular shape. LED package 50 can comprise a single emission area 54 or more than one emission area 54. LED package 50 can further comprise a retention material 56 disposed at least partially about emission area 54 where retention material 56 can be referred to as a "dam". Retention material 56 can also be disposed over at least one or more than one ESD protection device (not shown).

Substrate 52 can comprise any suitable mounting substrate, for example, a printed circuit board (PCB), a metal core printed circuit board (MCPCB), an external circuit, or any other suitable substrate over which light emitters, such as LED chips, may mount and/or attach. Emission area 54 can be in electrical and/or thermal communication with substrate 52. Emission area 54 can comprise a plurality of light emitters such as LED chips 22 disposed within and/or below a filling material 58 such as illustrated in FIG. 4. LED chips 22 can comprise any suitable size and/or shape of chip. One or more LED chips 22 can form a multi-chip array of chips. In one aspect, LED chips 22 can be arranged in one or more strings of LEDs, each string can comprise more than one LED chip electrically connected in series. Strings of LED chips 22 can be electrically connected in parallel to other strings of LED chips 22. Strings of LED chips 22 can be arranged in one or more patterns (not shown).

In one aspect, filling material 58 can comprise an encapsulant having a predetermined, or selective, amount of phosphors and/or lumiphors in an amount suitable for any desired light emission, for example, suitable for white light conversion. As discussed further herein, filling material 58 can comprise an improved material and/or method of making the same that improves the chemical resistance of package 50. Filling material 58 can interact with light emitted from the plurality of LED chips 22 such that a perceived white light, or any suitable and/or desirable wavelength of light, can be observed. Any suitable combination of encapsulant and/or phosphors can be used, and combinations of different phosphors for resulting in desired light emission can be used. For example, any phosphor adapted to emit yellow, green, and/or red light upon activation can be used.

Retention material 56 can be adapted for dispensing, or placing, about at least a portion of emission area 54. After placement of retention material 56, filling material 58 can be selectively filled to any suitable level within the space disposed between one or more inner walls of retention material 56. For example, filling material 58 can be filled to a level equal to the height of retention material 56 or to any level above or below retention material 56 as illustrated by FIG. 4, other levels are indicated by the broken lines in FIG. 4. The level of filling material 58 can be planar or curved in any suitable manner, such as concave or convex (i.e. see broken lines in FIG. 4).

Still referring to FIGS. 3 and 4, LED package 50 can further comprise at least one opening or hole, generally designated 60, that can be disposed through or at least partially through substrate 52 for facilitating attachment of LED package 50 to an external substrate or surface. For example, one or more screws can be inserted through the at least one hole 60 for securing package 50 to another member, structure, or substrate. LED package 50 can also comprise one or more electrical attachment surfaces 62. In one aspect, attachment surfaces 62 comprise electrical contacts such as solder contacts. Attachment surfaces 62 can be any suitable configuration, size, shape and/or location and can comprise positive and negative electrode terminals, denoted by the "+" and/or "−" signs on respective sides of package 50, through which an electrical current or signal can pass when connected to an external power source.

One or more electrically conducting wires (not shown) can be attached and electrically connected to attachment surfaces 62 when welded, soldered, or using any other suitable attachment method known. Electrical current or signal can pass into LED package 50 from the external wires electrically connected to the attachment surfaces 62 and into the emission area 54 to facilitate light output. Attachment surfaces 62 can electrically communicate with emission area 54 which comprises one or more LED chips 22. Attachment surfaces 62 can electrically communicate with first and second conductive traces 64 and 66 (FIG. 4) and, therefore with LED chips 22, which may be electrically connected using electrical connectors. Electrical connectors can comprise wirebonds 24 or other suitable members for electrically connecting LED chips 22 to first and second conductive traces 64 and 66.

As FIG. 4 illustrates, retention material 56 can be dispensed after wirebonding the one or more LED chips 22 such that retention material 56 is disposed over and at least partially covers at least a portion of the wirebonds 24. For example, the first and last, or outermost edge LED chips generally designated 22A for a given set or string of LED chips 22 can be disposed within retention material 56. LED chips 22 can be arranged, disposed, or mounted over a conductive pad 70. Conductive pad 70 can be electrically and/or thermally conductive and can comprise any suitable electrically and/or thermally conductive material. Strings of LED chips 22 can comprise diodes of the same and/or different colors, or wavelength bins, and different colors of phosphors can be used in the filling material 58 disposed over LED chips 22 that are the same or different colors in order to achieve emitted light of a desired wavelength. For example, one or more blue, green, red, red-orange, amber, or yellow LED chips 22 can be used. LED chips 22 can be configured to activate one or more phosphors, for example, yellow, green, blue, or red phosphors.

As FIG. 4 illustrates, one or more LED chips 22 can be electrically connected in series by one or more wirebonds 24. LED chips 22 can be arranged over conductive pad 70 and can thermally communicate directly with conductive pad 70 or indirectly through one or more intervening layers (not shown). LED chips 22 can attach to conductive pad 70 or intervening layers using any die attach techniques or materials as known in art and mentioned above, for example epoxy or metal-to-metal die attach techniques and materials. Conductive pad 70 can be formed integrally with substrate 52 or can comprise a layer separately disposed over substrate 52. Conductive pad 70 can dissipate heat generated by the one or more LED chips 22 through substrate 52 and away from the LED chips 22.

Referring to FIG. 4, outermost LED chips 22A for a given series, string, or pattern of LED chips 22 can electrically communicate or connect to one or more electrical elements. Electrical elements can comprise first and second conductive traces 64 and 66 configured to flow, or supply, electrical signal or current to the respective strings of LED chips 22. One of first and second conductive traces 64 and 66 can comprise an anode and the other a cathode. Conductive pad 70 and conductive traces 64 and 66 can comprise package components of any suitable electrical and thermally conductive materials and can comprise either the same or different materials. In one aspect, conductive pad 70 and conductive traces 64 and 66 can comprise package components having a layer or portion of Ag or Cu deposited over a portion of substrate 52 using any suitable technique. In one aspect, conductive pad 70 can comprise a component having a base material or base portion of material such as Cu. The base material can be plated, coated, or otherwise at least partially deposited or coated with a portion of reflective Ag or Ag-containing material. An electrically insulating solder mask 72 can be disposed at least partially between conductive pad 70 and respective conductive traces 64 and 66 to electrically isolate the pad from the traces. For illustration purposes, a string of four LED chips 22 is shown, but any number of LED chips is contemplated herein.

As FIG. 4 further illustrates, substrate 52 can further comprise a dielectric layer 74, and a core layer 76. For illustration purposes, substrate 52 can comprise a MCPCB, for example, those available and manufactured by The Bergquist Company of Chanhassan, Minn. Any suitable substrate 52 can be used, however. Core layer 76 can comprise a conductive metal layer, for example Cu or aluminum (Al). Dielectric layer 74 can comprise an electrically insulating, but thermally conductive material, to assist with heat dissipation through substrate 52.

Package 50 can comprise a package which does not require or use a secondary optics to keep harmful elements from degrading conductive pad 70. Where conductive pad 70 comprises Ag or a partial layer of Ag, the Ag can become tarnished, corroded, or otherwise degraded if package 50 has poor chemical resistance. For example, if undesirable chemical components permeate filling material 58 the Ag can tarnish or degrade, thereby resulting in a loss of brightness output and/or noticeable darkening of surface of conductive pad 70. Notably, packages, components, and methods disclosed herein provide for improved or optimized chemical resistance and improved chemical properties where zero or minimum loss of brightness occurs, even in the presence of harmful chemicals and can be applicable to any SMD package or multi-array package disclosed herein. Such improvements can keep the Ag coating from tarnishing, corroding, or otherwise degrading.

Figure 5:
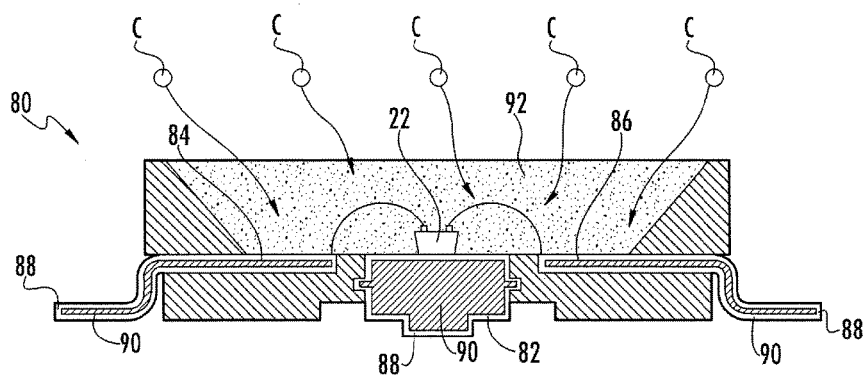
FIG. 5 is a cross-sectional view of a non-optimized LED package according to the disclosure herein.

FIG. 5 illustrates a cross-sectional view of an LED package having poor chemical resistance, generally designated 80. LED package 80 can be a same or similar package design as previously described package 10; however, it has not been improved for chemical resistance. Package 80 can comprise an SMD package having Ag, Ag-containing, and/or Ag-coated components disposed under a filling material such as encapsulant. Ag can advantageously reflect light emitted from the package, however, it can be corroded, tarnished, or otherwise degraded by various complexes or compounds present in the surrounding environment during operation.

Package 80 can comprise one or more LED chips 22 mounted over a thermal element 82 and electrically connected to one or more electrical elements 84 and 86. Thermal and electrical elements 82 and 84, 86 can comprise a coated or plated layer 88 disposed over a core layer 90. Coated layer 88 can comprise a layer of Ag which can be partially disposed over core 90 or fully disposed about core 90 as illustrated. Encapsulant 92 can be disposed over the one or more LED chips 22. In this embodiment, undesirable chemical vapors or complexes C can permeate the encapsulant 92 as indicated by the arrows and adversely affect the Ag coated layer 88. Undesired complexes C can comprise chemical vapors containing sulfur, sulfur containing compounds (sulfides, sulfites, sulfates, $SO_x$), chlorine or bromine containing complexes, nitride oxide ($NO_x$) and/or oxidizing organic vapor compounds. Complexes C can degrade the Ag and result in a loss of brightness output and noticeable darkening of the package. The current subject matter at least in part optimizes the chemical resistance of encapsulant 92 and/or encapsulant materials such that harmful vapors, chemicals, or complexes C cannot permeate the package and/or permeate the package to a lesser extent, thereby minimizing the damage to reflective Ag or Ag-containing components.

Package 80 and can comprise methyl silicone or polydimethylsiloxane (PDMS) type silicone encapsulants. Methyl silicones are known for excellent reliability properties when used as an encapsulant. Methyl silicones can provide physical protection against foreign solids and liquids and can protect Ag or Ag-containing components within the package from being compromised during exposure to solids and liquids. However, it has been found that methyl silicones do not provide adequate protection against gaseous or vaporous chemicals. In fact, methyl silicones are very permeable to airborne elements such as oxygen, moisture (or water vapor), as well as other airborne complexes and chemical vapor complexes including those which degrade Ag, for example, sulfur. While the permeability can comprise a measured property and a function of test condition, it is well known that the value of PDMS or methyl silicones is very high.

Phenyl or phenyl-containing silicones are known to have significantly lower permeability properties than methyl silicones and have been suggested for sulfur-resistant protection. For example, the oxygen gas permeability of methyl silicones is in the range of 30,000 to 40,000 cc/m$^2$/day at 23° C. for a 0.92 mm thickness sample. A phenyl silicone, such as KER-6000 (e.g., available and manufactured by Shin-Etsu Chemicals Co. Ltd., of Tokyo, Japan), is in the range of 5,500 cc/m$^2$/day at 23° C. for a 0.91 mm thickness sample, while phenyl silicone ASP-1110 (e.g., also available and manufactured by Shin-Etsu Chemicals Co. Ltd., of Tokyo, Japan), is in the range of 170 cc/m$^2$/day at 23° C. for a 0.92 mm thickness sample. The permeability can be further lowered by increasing the phenyl or cyclic hydrocarbon or cyclic silicone contents. However, phenyl silicones are also known for poor reliability as they are vulnerable to degradation at elevated temperatures and under light exposure. Phenyl silicones tend to be harder, more rigid and brittle, and they are known to cause LEDs to fail upon thermal shocking tests and large temperature changes. For these reasons, phenyl silicones are not generally used as an encapsulant for LEDs in high power and high brightness applications which require good reliability performance.

Notably, packages and components herein are improved; in part by providing or incorporating a phenyl silicone encapsulant into LED packages and components in order to take advantage of advantage chemical resistant properties of phenyl silicone, while minimizing the adverse thermal properties. Thus, the subject matter herein discloses that it is possible to develop chemically resistant SMD type LED packages and components using phenyl silicone encapsulant, because phenyl silicone has excellent long term reliability performance and superior protection against Ag-degrading chemical vapors.

Phenyl silicones are silicones or polyorganosiloxanes that comprise aromatic entities as part of their structure. Examples of aromatic entities include $(C_6H_5)SiO_x$ or $PhSiO_x$, where Ph represents phenyl functionality $(C_6H_5)$. One representation of phenyl silicone can be $R_x(C_6H_5)_ySiO_{(4-x-y)/2}$, where x, y are values between 1 and 4, respectively, and $1<(x+y)<4$, and where R is an independent hydrocarbon group. Phenyl-containing silicones or polyorganosiloxanes can also contain other functionalities, for example, reactive functional groups. Phenyl-containing silicones can have a linear, branched, cyclic, or resinous siloxane structure. Suitable phenyl silicones for the subject matter herein can comprise single or multiple phenyl functionalities within one molecule. Suitable phenyl silicones can also comprise polyorganosiloxanes, cyclic hydrocarbon-containing silicones, or polyorganosiloxanes. Examples of cyclic hydrocarbon entities include without limitation norbornene, naphthalene, anthracene, cyclohexene, cyclohexane, cyclohexadiene, cyclopentane and cyclopentene. Phenyl-containing silicones or cyclic hydrocarbon-containing silicones can further contain cyclic-silicones or compounds as part of its structures.

Notably and as further discussed herein, phenyl or phenyl-containing silicone encapsulants can advantageously offer broad protection against a wide variety of chemical vapors. For example, phenyl silicone can offer protection against chemical vapors such as sulfur, sulfur-containing compounds (e.g., sulfites, sulfates, $SO_x$), chlorine and bromine containing complexes, nitride oxide ($NO_x$), and oxidizing organic vapor compounds to name a few. As further illustrated herein, LED packages and/or components which utilize phenyl silicone encapsulants show improved chemical resistant properties over conventional LED packages. Any suitable phenyl silicone encapsulant can be chosen for use, for example only and not limited to formulations derived available and manufactured by Shin-Etsu Chemicals Co. Ltd., of Tokyo, Japan. These meet the suggested hardness (noted in parenthesis) and include, without limitation, LPS-5544 (A55), LPS-5545 (A76), LPS-5535 (A58), LPS-3541 (A70), LPS-5547 (A87), LPS-5539 (A85), and LPS-5514 (D40). Additional examples of other commercially available phenyl silicones from Shin-Etsu Chemical Company (Tokyo, Japan) include KER-6000 (A20), KER-6050 (A50), ASP-1020 (A65), ASP-1120 (A60), KER-6100, ASP-1110 (D60), and ASP-1040 (D40). A number of other phenyl silicones are commercially available from Dow Corning Corporation, headquartered in Midland, Mich. and meet the suggested hardness (noted in parenthesis). Such silicones include, without limitation, OE-6520 (A26), OE-6550 (A62), OE-6635 (D33), OE-6630 (D41), OE-6636 (D35), and OE-6662 (D60). Such formulations have demonstrated improved chemical resistant properties when incorporated into improved LED packages and/or disposed over components of LED packages as described herein as compared to methyl silicones. In one aspect, high reflective index (HRI) phenyl silicones are used.

Cured phenyl silicones can also offer hardness values which are compatible with LED chips and die attach materials presently in use. Hardness can be one factor to consider for providing packages and components having improved chemical resistant properties. In one aspect, a silicone encapsulant in accordance with the subject matter herein can have a hardness between and including approximately A20 (a value of 20 with a scale A probe for hardness test) and approximately D60 (value of 60 with scale D probe for hardness test). In another aspect, suitable encapsulants can have a hardness between and including approximately A30 and approximately D40. In one aspect, the cure conditions of phenyl silicones can yield a cured hardness range between and including approximately A30 and approximately A80 based upon type-A durometer testing. In one aspect, the cured hardness can be from between and including approximately A40 to approximately A70 based upon type-A durometer testing. Notably, phenyl silicones used in packages and components described herein have been formulated in specific cure conditions so that the cured silicones render high reliability performance while maintaining desirable hardness.

To achieve desired hardness and/or reliability performance, phenyl silicones, in accordance with the subject matter herein, can be further incorporated with hardness-modifiers, additives, fillers, binders, or by adjusting the ratio of component A to component B ratio (note: most silicone encapsulants are provided in two component packages: component A and component B). Independently, phenyl silicones with desired hardness can be obtained by optimizing the cure conditions to achieve a degree of cure that is optimal for the LED applications. Optimal cure conditions for phenyl silicones are typically found at temperatures between approximately 100° C. and 200° C., with a cure time approximately between a few minutes to a few hours. Also of note, phenyl silicones are compatible with presently used phosphors to allow high conversion efficiency and can offer improved light output than methyl silicones.

FIGS. 6A and 6B are photographs of a unimproved or non-optimized LED packages versus FIGS. 7A and 7B which are photographs of improved LED packages, which have been improved for chemical resistance against harmful chemical complexes. The unimproved or non-optimized packages, shown in FIGS. 6A and 6B, can comprise an SMD similar to package 80 discussed above, which does not have an improved resistance to chemical vapors. In one aspect, the non-optimized package uses methyl silicone encapsulant. As the photographs of FIGS. 6A and 6B indicate, corrosive elements or complexes are able to permeate the encapsulant and corrode, tarnish, darken, or otherwise degrade the Ag coated thermal and electrical elements within the package.

FIG. 6A shows the non-optimized package as having significant discoloration at the center of the package after moderate exposure to sulfur and intense darkening after extended sulfur exposure. In comparison, FIGS. 7A and 7B show an SMD similar to package 10 in which the chemical resistance has been improved by altering one or more of the material type, cure time, cure temperature, or other variables of the encapsulant, thereby improving the chemical resistance thereof. For example, the improved or optimized LED package of FIGS. 7A and 7B can use a phenyl silicone encapsulant, such as for example and without limitation, an ASP-1120 silicone available and manufactured by Shin-Etsu Chemicals Col., Ltd. of Tokyo, Japan. This formulation can comprise an A/B mix ratio with the prescribed amount of phosphors. The formulated mixture of encapsulant used in the improved package can be cured at approximately 150° C. for approximately 3 hours. This cure condition can produce a cured silicone network with a hardness within a targeted hardness value between and including A40 and A70.

FIGS. 7A and 7B also show the appearance of the improved or optimized packages after exposure to sulfur vapors. The improved packages exhibit no apparent discoloration after moderate exposure to sulfur and a faint or light visible discoloration after extended exposure. As FIGS. 7A and 7B illustrate, the Ag, Ag-containing, and/or Ag-coated components, such as Ag coated thermal and electrical elements of the packages are not as damaged or as darkened as are thermal and electrical elements seen in the counterpart photographs of FIGS. 6A and 6B. Photographs in FIGS. 6A and 7A were taken after the packages were exposed to a moderate sulfur atmosphere at 70° C., considered a Level 1 exposure. Photographs in FIGS. 6B and 7B were taken after the packages were exposed to an extended sulfur atmosphere at 70° C., considered a Level 3 exposure.

The chemical resistant properties of LED packages, and alternatively the degradation or darkening resistance of the Ag or Ag-containing components within the LED packages can be evaluated by a number of methods. One simple and effective method can comprise exposing Ag-containing components of LED packages to harmful chemical vapors at selected temperature for a selected period of time. The brightness of the LED packages can be compared before and after the exposure and the appearance of the LED packages can be inspected.

Many chemical vapors are known to cause darkening, or tarnishing of Ag or Ag-containing components within LED packages. For example, sulfur and many sulfur-containing compounds have been known to cause Ag darkening on contact. Forms of sulfur compounds include sulfides, sulfites, and sulfates. Examples of sulfur-containing compounds include hydrogen sulfide ($H_2S$), sulfur compounds, sulfur dioxide ($SO_2$), carbon disulfide ($CS_2$). Other sulfur-containing compounds may be found in vulcanized rubbers and can be the source of sulfur compounds leading to Ag degradation. Examples of such compounds include, without limitation, sodium metabisulfate and mercaptans, dimethyldithiocarbamate, and aluminum sulfate.

Exposure tests can also be carried in the presence of additional water or water vapor with the intent to increase the water vapor or humidity in the test environment. The additional water vapor creates a wet atmosphere which may accelerate the darkening of Ag or Ag-containing components in some test gases or media. Exposure temperature can be a factor in determining chemical resistance properties of LED packages and components. Typically, the higher the test temperature, the faster the diffusion rate. Therefore, the permeability of chemical vapors through the encapsulant layer at 50° C. seems to be an adequate test temperature as it allows for a good acceleration over the room temperature condition without being too aggressive on the LED packages and/or components. Higher temperatures may be used, and may represent harsher environments.

Figure 8:
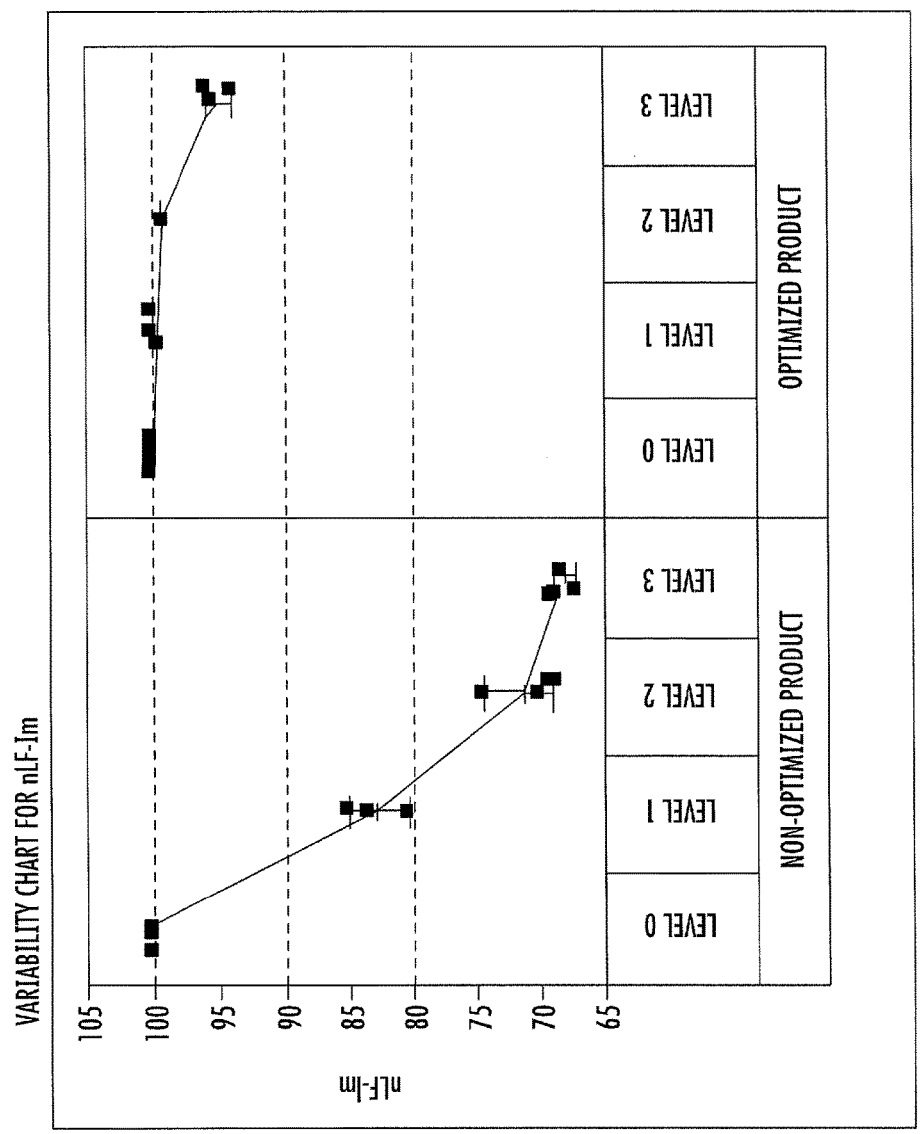
FIG. 8 is a graphical illustration of brightness loss for non-optimized and optimized LED packages at different chemical vapor exposure levels according to the disclosure herein.

FIG. 8 illustrates a variability chart illustrating the improvement in optical performance, specifically, the reduction in brightness degradation or brightness loss output for the improved packages of FIGS. 7A and 7B using high phenyl silicone encapsulant compared with unimproved packages using methyl silicone encapsulant of 6A and 6B. The exposure results may be obtained using one of the evaluation methods previously described. Optimized and non-optimized packages can comprise the same package design for accurate comparison, that is, optimized and non-optimized packages may have the design of package 10 or 50 but the optimized packages can comprise phenyl silicone encapsulant processed at an appropriate cure conditions instead of the conventional methyl silicone encapsulant used in unimproved packages. That is, improved packages comprise packages improved for chemical resistance and chemical resistance properties.

The left hand side of FIG. 8 illustrates the brightness degradation or ratio of brightness loss for conventional LED packages which are non-optimized for chemical resistance. As the left hand side of FIG. 8 illustrates, the brightness, or luminous flux, for non-optimized packages decreases more than 30% after exposure at various levels to adverse chemical vapors, such as sulfur or sulfur complexes. Level 0 can comprise a base or control value taken at approximately zero exposure for comparing to exposure at Levels 1-3 in which the exposure to sulfur and/or sulfur containing complexes ranges can be mild (Level 1, or 0.5 hour), moderate (Level 2, or 2 hours), and high (Level 3, or 4 hours).

As FIG. 8 illustrates, non-optimized packages degrade approximately 15% or more when exposed at Level 1, approximately 25% or more at Level 2, and approximately 30% or more at Level 3 (based on approximate value ranges). The non-optimized packages suffered an average 32% loss of light. The right hand side of FIG. 8 illustrates that optimized packages exhibit a significant improvement in the amount of brightness degradation when exposed to chemical vapors containing sulfur and/or sulfur complexes. For example, optimized packages using phenyl silicone encapsulant degrade approximately 2% or less at Levels 1 and 2 and approximately 5% or less at Level 3 than their non-optimized counterparts. Thus, improved or optimized packages using phenyl silicone encapsulant can advantageously lose less light than non-optimized packages using methyl silicone encapsulant. Improved or optimized packages can significantly improve the loss of brightness output. In one aspect, the reduction in light degradation or loss of brightness output for an optimized package can be improved approximately six-fold over that of a non-optimized package (e.g., at extended sulfur exposure, there is approximately 32% on average loss for versus less than approximately 5% loss on average for an optimized package at Level 3). Contrary to conventional thinking and quite unexpectedly, improved or optimized packages which use high phenyl silicone encapsulant, where the encapsulant is processed according to the disclosure herein, showed excellent reliability performance.

Figure 9A:
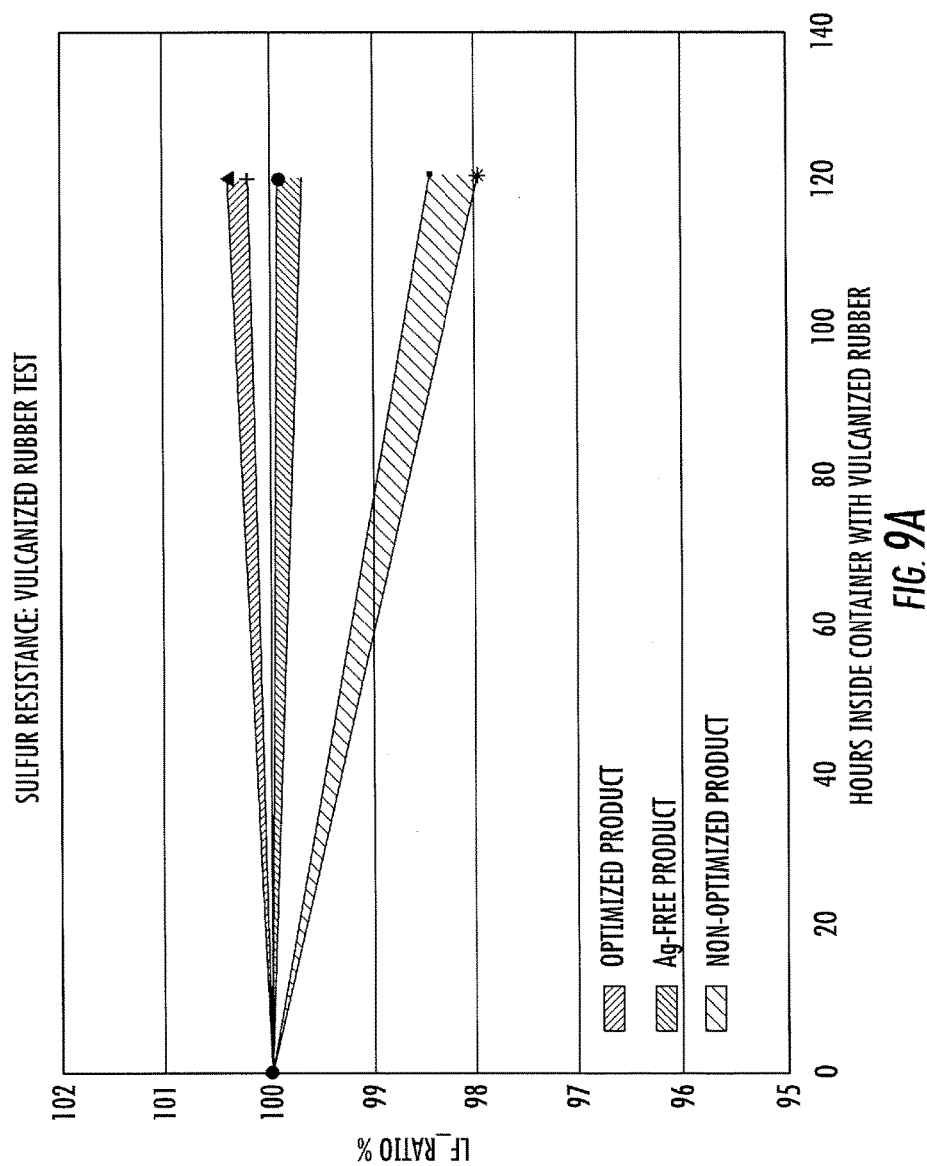
FIGS. 9A and 9B are graphical illustrations of brightness loss for non-optimized, optimized, and Ag-free or commercial packages at different chemical vapor exposure levels according to the disclosure herein.
Figure 9B:
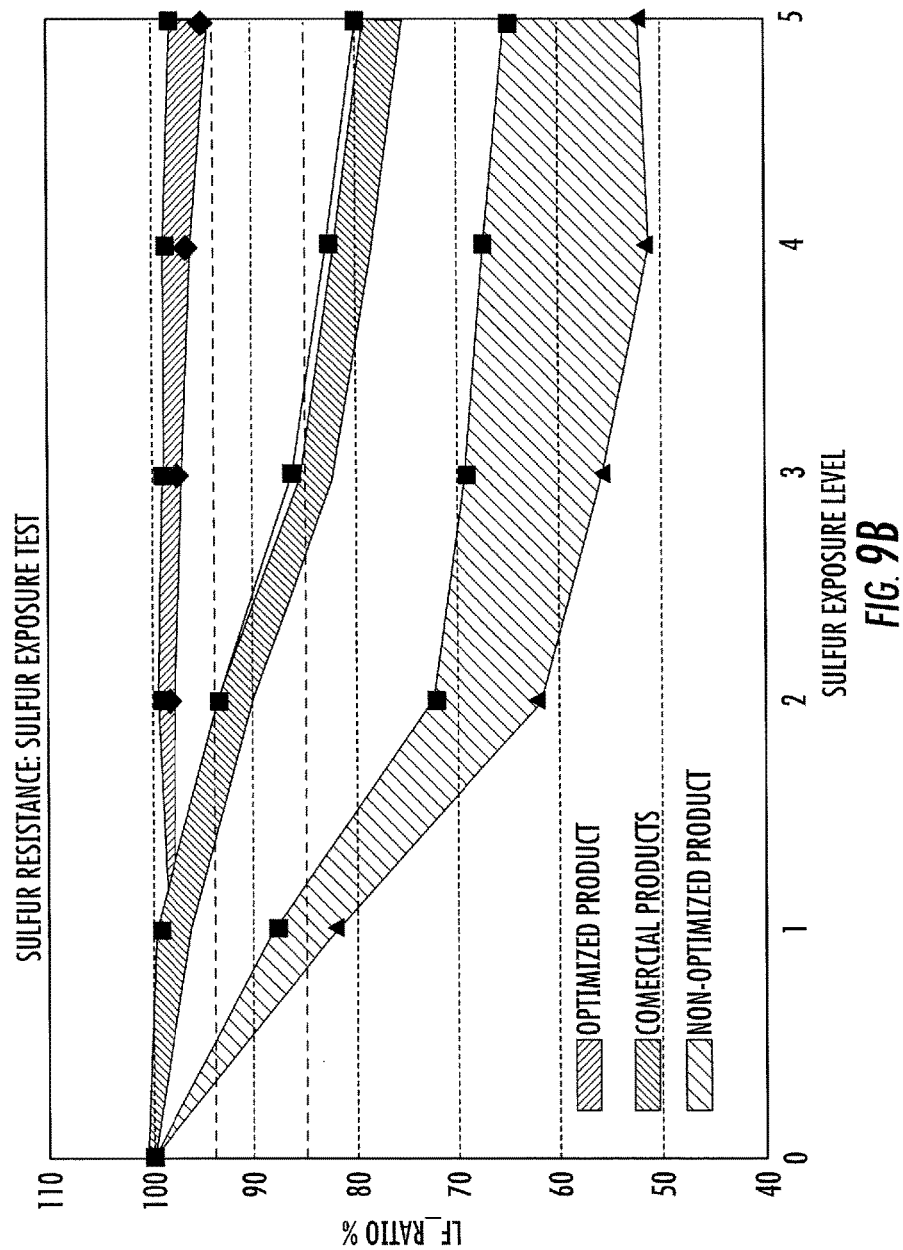

FIGS. 9A and 9B are graphs illustrating the amount of light lost for optimized, non-optimized, and Ag-free or commercially available package(s) that use methyl silicone. Non-optimized and Ag-free or commercial packages measured in FIGS. 9A and 9B include SMD packages using conventional methyl silicone encapsulant. Optimized packages can comprise the same package design as non-optimized packages, but at least one difference can be the use of a phenyl silicone encapsulant processed according to sufficient cure conditions. FIG. 9A illustrates the brightness degradation of the packages, measured after the packages were subjected to the vulcanized rubber test, which is a mild test used to measure sulfur resistance. The packages were measured after various exposure times inside container with vulcanized rubber. Subsequently, the non-optimized package decreased in brightness approximately 2% after 120 hours of exposure, and the optimized package showed no apparent decrease in brightness, and the Ag-free package decreased less than 1%.

FIG. 9B illustrates another sulfur exposure test harsher in nature than the vulcanized rubber test. This test further differentiated the sulfur chemical resistance in optimized, non-optimized, and commercial package, the optimized package using phenyl silicone encapsulant and the non-optimized and commercial package using conventional methyl silicone encapsulant. During the harsher sulfur exposure test, the optimized package degraded less than the non-optimized and commercial package. For example, the optimized package degraded less than approximately 10% when subjected to a Level 5 sulfur exposure level, the commercial package degraded approximately 20% or more when subjected to a Level 5 sulfur exposure, and the non-optimized packages which can have the same package design as the optimized package degraded approximately 35% or more when exposed to the Level 5 sulfur exposure. Additionally, the non-optimized package sharply declined in light output during the first two levels of exposure, and then gradually declined after Level 2. As FIGS. 9A and 9B illustrate, the package optimized for chemical resistance lost less light, or degraded less, than the non-optimized, Ag-free, and/or other commercially available packages.

FIGS. 10A to 10D are photographs of the non-optimized and optimized packages after Level 1 and Level 3 sulfur exposure measured in FIG. 9B. After Level 1 exposure, the non-optimized package in FIG. 10A is visually darker than the optimized package in FIG. 10C. At Level 3 exposure, the non-optimized package in FIG. 10B is significantly darker than the optimized package in FIG. 10D, which appears mildly discolored. At Levels 1 and 3, the optimized package lost approximately 5% or less of light output. At Level 1, the non-optimized package lost approximately 15% of light output, on average, and approximately 35% at Level 3. Notably, the optimized package visually degrades less, which is confirmed by the brightness measurements. Thus, the use of phenyl silicone encapsulant can improve and/or optimize the chemical resistance, for example, sulfur resistance of LED packages.

Figure 11:
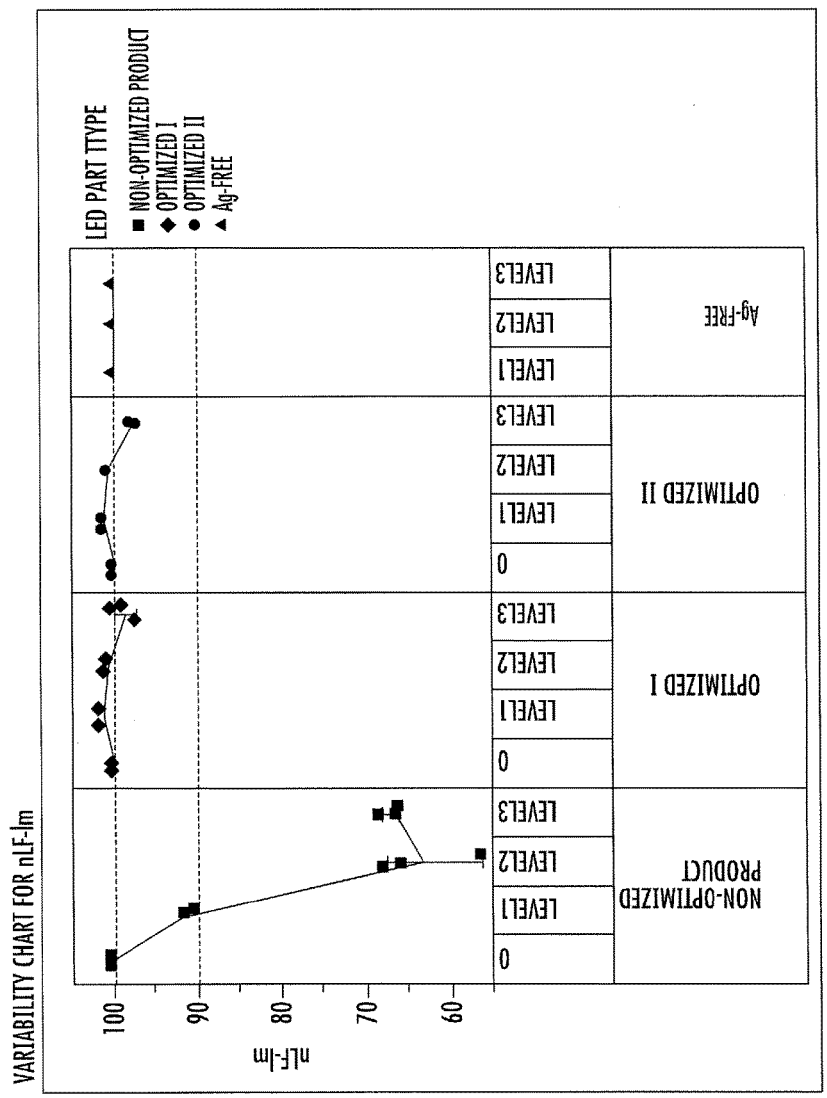
FIG. 11 is a graphical illustration of various non-optimized, optimized, and Ag-free LED packages at different chemical vapor exposure times according to the disclosure herein.

FIG. 11 is a variability chart graphically comparing the brightness degradation, or brightness loss output of various non-optimized, optimized, and Ag-free LED packages after different exposure levels and/or exposure times to sulfur chemical vapors. In this test, the optimized packages outperformed the non-optimized packages of the same package design and the Ag-free packages at certain levels of exposure. As illustrated in FIG. 11, one difference between the optimized package and other packages in the chart is that phenyl silicone was used to encapsulate the optimized packages in order to improve chemical resistance thereof.

Figure 12A:
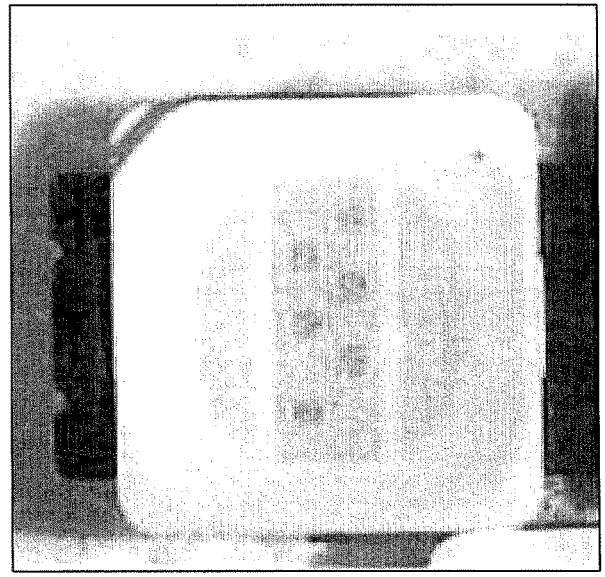
FIGS. 12A and 12B are photographs of non-optimized and optimized LED packages after exposure to chemical vapors according to the disclosure herein.
Figure 12B:
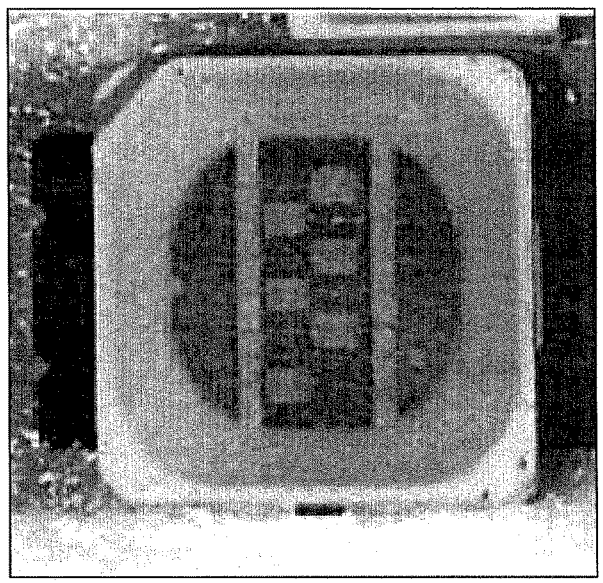

FIGS. 12A and 12B are photographs of optimized and non-optimized LED packages at a Level 3 exposure to sulfur taken during the collection of data for the chart in FIG. 11. As the photographs indicate, the Ag coated components within the non-optimized package in FIG. 12B are significantly more discolored, darkened, and tarnished than the components within the improved optimized package in FIG. 12A. The darkened components absorb and/or reflect less light from the package, thereby adversely affecting performance of the LED package and could also result in possible failures during operation. Ag tarnishing can be attributed to multiple causes, for example, if a flux die attach is used, any residue on the thermal slug surface becomes visually different after sulfur exposure. Conventional encapsulants, such as methyl silicones are very permeable to adverse chemical vapors such as moisture, oxygen, and sulfur. Thus, one area of optimization of chemical resistance for LED packages is the use of phenyl silicone as an encapsulant. Discoloration may occur where sulfur or oxidizing species build up or deposit at the Ag surface.

Figure 14:
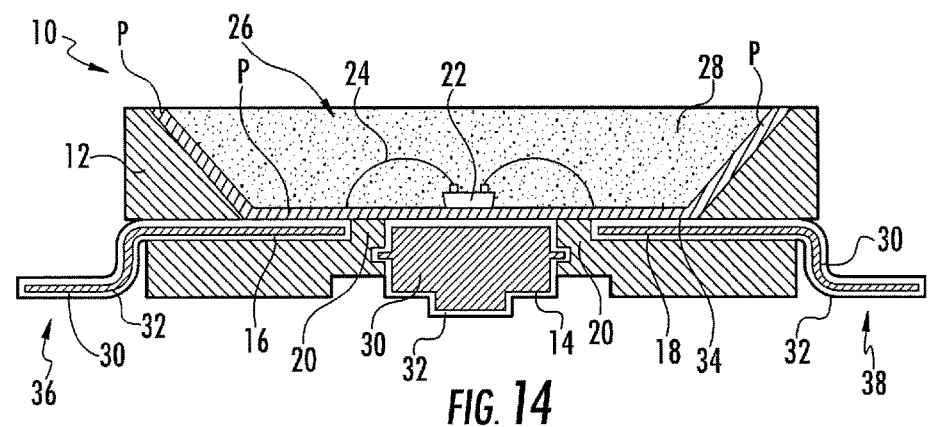
Figure 15:
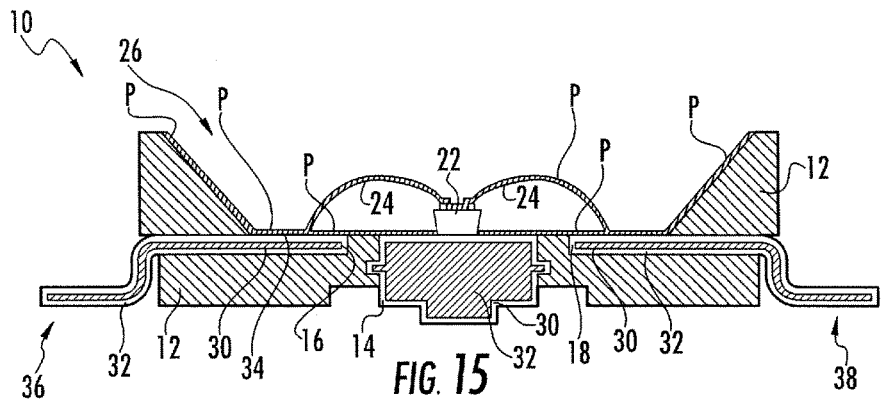
Figure 16:
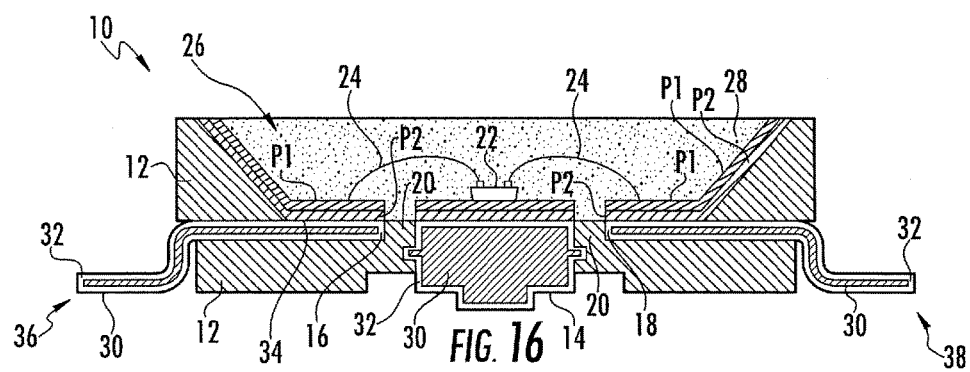

FIGS. 13 to 16 illustrate previously described LED package 10 which can further comprise various protective layers within the LED package to prevent Ag tarnishing and/or degradation. FIGS. 13 to 16 illustrate a protective coating or layer P which can be applied over the Ag-containing thermal and electrical components 14 and 16, 18 at different stages of production of package 10. FIG. 16 illustrates more than one protective layer, for example, first and second protective layers P1 and P2. For illustration purposes only, the number of protective layers shown is two; however, any suitable number of protective layers applied at any step during or after the production process is hereby contemplated. Protective layers P, P1, and P2, can comprise organic or metallic barrier layers. Protective layers P, P1, and P2 can also comprise dielectric coatings, for example, $TiO_2$, $SiO_2$, and/or $Al_2O_3$, which can be deposited using any suitable process such as chemical vapor deposition (CVD), PECVD, physical vapor deposition (PVD), wet chemistry methods, or dispersing the dielectric. Dielectric layers may then be coated with silicone encapsulant. Protective layers P, P1, and P2 can also comprise a silicon coating, or double silicone layers that could each provide different features. Protective layers P may be used either alone or in combination with phenyl silicone encapsulant to improve the chemical resistance of LED packages as described herein.

As FIGS. 13 to 16 illustrate and in one aspect, LED packages 10 and/or 50 can comprise SMD with protective layers P, P1, and P2 comprising organic barrier coatings disposed over portions of an Ag or Ag-containing reflective component or substrate, and may then optionally be coated with methyl and/or phenyl containing silicone encapsulants. The barrier coating or layer can be applied over portions of Ag or Ag-containing components or surfaces (e.g. coating 32) of package 10 to prevent harmful chemical vapors from reaching the Ag surface. As previously noted, package 10 can comprise a base material (e.g., base or core material 32), a Ag-containing material (e.g., Ag-containing coating 32) at least partially disposed over the base material, and a protective layer or coating (e.g., P, P1, and/or P2) at least partially disposed over the Ag-containing material (e.g., coating 32). Suitable organic barrier protective layers or coatings can comprise Si containing coatings including those derived from organosilicone compounds, reactive silicones compounds or reactive silanes. Such compounds are generally delivered in solution form which allows for ease of application and thickness control. Other organic compounds and organic polymers that have known barrier properties may be used for protective layers P, P1, and P2 either alone, or in conjunction with organosilicones or reactive silanes.

Furthermore, protective layers P, P1, and P2 may comprise metallic barrier coatings over the Ag or Ag-containing portions of package components, and then may be coated with silicone encapsulants. A metallic protective layer P or coating may be applied directly over the Ag-substrate (e.g., coating 32) as a barrier layer and in particular, oxidation resistant metals used. Alternatively, protective layers P, P1, and P2 may comprise a layer of oxides with dielectric properties that can be applied directly over the Ag-substrate as a barrier layer. Known dielectric materials can be used. Protective layers P, P1, and P2 may also comprise organic-inorganic barrier coatings. Alternatively, a layer of organic-inorganic hybrids or the oxide form of organic-inorganic coatings can be used as layers P, P1, and P2. These can be prepared and derived from sol-gel coatings.

The above mentioned layers P, P1, and P2 or barrier coatings (organic, inorganic, organic-inorganic hybrid coatings) can be derived from solutions, dispersions, or sol-gel coatings. Processes and/or methods of applying above barrier coatings can comprise, without limitation: spraying, spin-coating, dispense-coating, spin-on-glass, or chemical vapor deposition (CVD) method, or by metal organic chemical vapor deposition (MOCVD) method, or by physical vapor deposition (PVD) or plasma deposition. The above layers P, P1, and P2 may be applied at various processing steps during LED package construction as described below. The layers or coatings may be present, at a minimum, over the Ag coating or substrate component of the LED package. Protective layers P, P1, and P2 may be applied directly onto the Ag-containing coating or substrate and before the processing step of molding the LED reflector cavity 26 (i.e. side walls). In one aspect, protective layers P, P1, and P2 can be applied onto the LED package before the processing step of die placement, such that the barrier coating covers the Ag-substrate and reflector side walls of the package. Alternatively, protective layers P, P1, and P2 may be applied onto the LED package after the processing step of die placement and wire-bonding, so that the protective layers P, P1, and P2 cover the Ag-substrates, reflector side walls, LED chips 22, and wirebonds 24.

Figure 13:
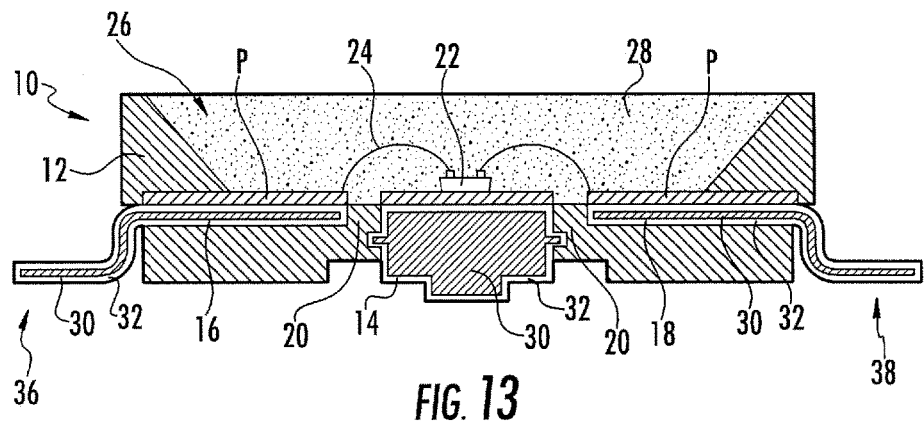
FIGS. 13 to 17 are cross-sectional views showing different embodiments of protective layers offering protection against chemical vapors according to the disclosure herein.

As FIG. 13 illustrates, protective layer P can be applied, deposited, or otherwise disposed over electrical and thermal elements 14, 16, and 18, before the processing step of molding the package body 12 about the leadframe components. That is, protective layer P can extend below at least a portion of the molded plastic body 12, such that it contacts one or more surfaces of package body 12. In one aspect, protective layer P can be disposed between one or more portions of package body 12 as illustrated in FIG. 13.

FIG. 14 illustrates an embodiment where protective layer P has been deposited after the processing step of molding the body 12, but before the LED die attach and/or wirebonding steps. Thus, protective layer P can extend below LED chip 22 and along at least a portion of cavity floor 34. Protective layer P can extend between upper surfaces of thermal element 14 and LED chip 22. In one aspect, protective layer P can be disposed over entire surface of cavity floor 34, thus, disposed over surfaces of each of thermal and electrical elements 14, 16, and 18. In a further aspect, protective layer P can optionally extend up the side walls of reflector cavity 26 as shown in FIG. 14.

FIG. 15 illustrates protective layer P being applied after the processing step of wirebonding but before the processing step of dispensing encapsulant 28. In one aspect, protective layer P can at least partially coat surfaces of wirebonds 24, LED chip 22, walls of cavity 26, cavity floor 34, and surfaces of electrical elements 16 and 18.

Figure 17:
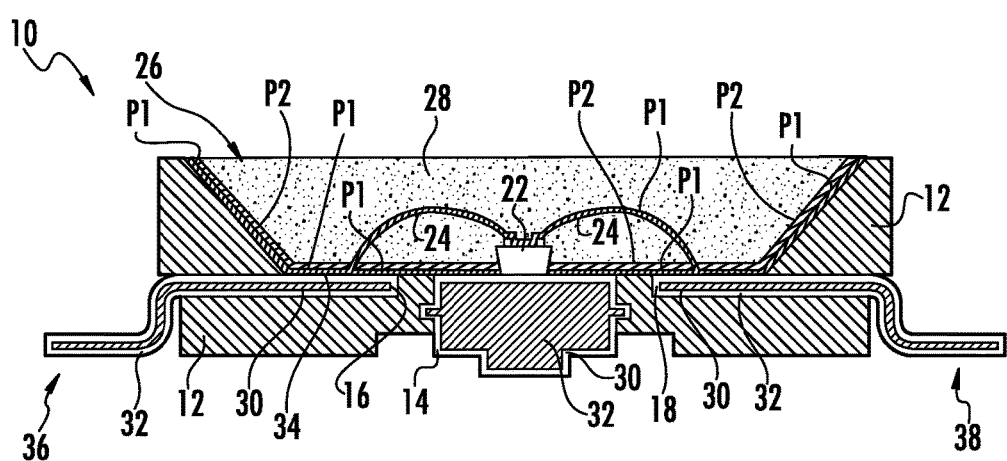

FIG. 16 illustrates an embodiment where more than one protective layer can be applied, for example, first protective layer P1 and second protective layer P2. First and second protective layers P1 and P2 can be applied at any processing step during production of LED package 10, thereby assuming the placement illustrated and described in FIGS. 13 to 15 (except it will comprise more than one layer). For example, FIG. 17 illustrates the embodiment of FIG. 15, but with first and second protective layers P1 and P2. Alternatively, first and second layers P1 and P2 can be applied, as shown, over upper surfaces of thermal and electrical elements 14, 16, and 18 before die attaching LED chip 22. First and second layers P1 and P2 can optionally extend up side walls of reflector cavity 26. In addition, Ag-containing alloys can be used instead of pure Ag. Ag alloys may contain other metals such as titanium (Ti) or nickel (Ni).

EXAMPLES

Improved chemical resistance of LED packages made according to the present subject is shown below. Two sets of LED packages were made (conventional, non-optimized LED packages and optimized LED packages having improved chemical resistance) from a package having Ag as the reflector substrate. The LED packages were placed in a container in which a vulcanized rubber is placed. The container was placed in a 50° C. oven for 24 hrs. The LED packages were exposed to the off-gases from the vulcanized rubber which may lead to degradation and darkening of the Ag substrate. The exposed LED packages were subsequently inspected for discoloration. The optical and electrical performance of the LED packages after exposure was compared to the prior exposure values, in Table 1 below:

TABLE 1

| LED Type | Encapsulant Type | Exposure Temperature, ° C. | Exposure Hours | Brightness % |
|---|---|---|---|---|
| Non-optimized LED package 1 | Methyl silicone | 50 | 0 | 100.0 |
| Non-optimized LED package 1 | Methyl silicone | 50 | 24 | 90.4 |
| Non-optimized LED package 2 | Methyl silicone | 50 | 0 | 100.0 |
| Non-optimized LED package | Methyl silicone | 50 | 24 | 89.7 |
| Optimized LED package 1 | Phenyl silicone | 50 | 0 | 100.0 |
| Optimized LED package 1 | Phenyl silicone | 50 | 24 | 100.0 |
| Optimized LED package 2 | Phenyl silicone | 50 | 0 | 100.0 |
| Optimized LED package 2 | Phenyl silicone | 50 | 24 | 100.1 |

As shown in Table 1 above, a non-optimized LED packages can lose approximately 10% brightness, while improved or optimized LED packages have no brightness loss after exposure to vulcanized rubber.

Embodiments of the present disclosure shown in the drawings and described above are exemplary of numerous embodiments that can be made within the scope of the appended claims. It is contemplated that the configurations of LED packages and components optimized for chemical resistance and methods of making the same can comprise numerous configurations other than those specifically disclosed.

What is claimed is:

1. A component of a light emitter package, the component comprising:
   a base material configured to support a light emitter chip;
   a silver (Ag) containing material at least partially disposed over the base material, wherein the Ag containing material comprises an upper surface;
   the light emitter chip disposed over a portion of the upper surface of the Ag containing material, the light emitter chip comprising an attach surface that opposes the upper surface of the Ag containing material; and
   a protective layer at least partially disposed between portions of the upper surface of the Ag containing material and the attach surface of the light emitter chip, the protective layer disposed over portions of the light emitter chip and electrical connectors extending from the light emitter chip, the protective layer at least partially comprising a metallic, dielectric, or organic material for increasing chemical resistance of the Ag containing material, wherein the protective layer comprises a Si containing layer of material encapsulating the Ag containing material, light emitter chip and electrical connectors extending from the light emitter chip;
   wherein a portion of the Ag containing material having the protective layer is encapsulated in a volume of phenyl containing silicone, wherein the upper surface of the Ag containing material and the volume of phenyl containing silicone encapsulant are disposed on opposing and at least partially parallel sides of the protective layer, wherein the volume of phenyl containing silicone comprises a cured hardness ranging from approximately A30 to approximately A80.

2. The component of claim 1, wherein the volume of phenyl containing silicone is curable between approximately 100° C. and approximately 200° C.

3. The component of claim 1, wherein the volume of phenyl containing silicone is curable at approximately 150° C.

4. The component of claim 1, wherein the volume of phenyl containing silicone comprises a cured hardness ranging from approximately A40 to approximately A70.

5. The component of claim 1, wherein the volume of phenyl containing silicone comprises a cured hardness ranging from approximately A20 to approximately D60.

6. The component of claim 1, wherein the light emitter chip is wirebonded to a portion of the Ag containing material.

7. The component of claim 1, wherein the phenyl containing silicone encapsulant comprises at least one phosphor disposed therein.

8. The component of claim 1, wherein the base material comprises copper (Cu).

9. The component of claim 1, wherein the component is incorporated within a surface mount device (SMD) type light emitter package.

10. A light emitting package comprising:
    a silver (Ag) containing component;
    one or more light emitting diode (LED) chips disposed over the Ag containing component;
    a first protective layer at least partially disposed over the Ag containing component, the first protective layer at least partially comprising a metallic, dielectric, or organic material for increasing chemical resistance of the Ag containing component, wherein the first protective layer comprises a Si containing layer of material;
    a second protective layer at least partially disposed over the first protective layer, the second protective layer at least partially comprising a metallic, dielectric, or organic material for further increasing chemical resistance of the Ag containing component;
    wherein a portion of the first protective layer is disposed over portions of the one or more LED chips and electrical connectors extending from the one or more LED chips;
    wherein the first protective layer is disposed between portions of a molded body of the LED package; and
    a layer of silicone that encapsulates portions of the Ag containing component having the first and second protective layers, the one or more LED chips, and electrical connectors extending from the one or more LED chips.

11. The package of claim 10, wherein the first protective layer comprises a compound derived from an organosilicone, a reactive silicone, or a reactive silane.

12. The package of claim 10, wherein the Ag containing component comprises multiple components formed from a leadframe.

13. The package of claim 10, further comprising a reflector cavity.

14. The package of claim 13, wherein the first protective layer is disposed over sidewalls of the reflector cavity.

15. The package of claim 13, wherein the layer of silicone comprises a phenyl containing silicone encapsulant material that is disposed in the reflector cavity.

16. The package of claim 15, wherein the phenyl containing silicone encapsulant material is curable at approximately 150° C.

17. The package of claim 15, wherein the phenyl containing silicone encapsulant material comprises a cured hardness ranging from approximately A30 to approximately A80.

18. The package of claim 15, wherein the phenyl containing silicone encapsulant material comprises a cured hardness ranging from approximately A40 to approximately A70.

19. The package of claim 15, wherein the phenyl containing silicone encapsulant material comprises a cured hardness ranging from approximately A20 to approximately D60.

* * * * *